United States Patent
Han et al.

(10) Patent No.: US 10,739,728 B2
(45) Date of Patent: Aug. 11, 2020

(54) MOLECULAR CLOCK

(71) Applicant: Massachusetts Institute of Technology, Cambridge, MA (US)

(72) Inventors: Ruonan Han, Winchester, MA (US); Cheng Wang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/233,982

(22) Filed: Dec. 27, 2018

(65) Prior Publication Data

US 2019/0235445 A1 Aug. 1, 2019

Related U.S. Application Data

(60) Provisional application No. 62/623,214, filed on Jan. 29, 2018.

(51) Int. Cl.
| | |
|---|---|
| H03L 7/26 | (2006.01) |
| H03B 17/00 | (2006.01) |
| G04F 5/14 | (2006.01) |
| H03L 7/099 | (2006.01) |
| H04B 1/10 | (2006.01) |
| H04B 1/30 | (2006.01) |
| H04B 1/18 | (2006.01) |

(Continued)

(52) U.S. Cl.
CPC .............. *G04F 5/145* (2013.01); *G04F 5/14* (2013.01); *H03B 17/00* (2013.01); *H03J 7/00* (2013.01); *H03L 7/0992* (2013.01); *H03L 7/1976* (2013.01); *H03L 7/26* (2013.01); *H04B 1/1027* (2013.01); *H04B 1/18* (2013.01); *H04B 1/30* (2013.01)

(58) Field of Classification Search
CPC . G04F 5/14; G04F 5/145; H01P 3/122; H01P 5/08; H01P 5/10; H03B 17/00; H03J 7/00; H03L 7/26; H04B 1/1027; H04B 1/18; H04B 1/30
USPC ........................................... 331/3, 94.1
See application file for complete search history.

(56) References Cited

U.S. PATENT DOCUMENTS

| | | | | |
|---|---|---|---|---|
| 2,602,835 A | * | 7/1952 | Hershberger | G01N 24/008 324/636 |
| 2,602,897 A | * | 7/1952 | Norton | H03L 7/26 331/3 |

(Continued)

OTHER PUBLICATIONS

Antonio, et al.; "Frequency stabilization in nonlinear micromechanical oscillators"; Nature Communications; 3:806; May 1, 2012; 6 Pages.

(Continued)

*Primary Examiner* — Levi Gannon
(74) *Attorney, Agent, or Firm* — Daly, Crowley, Mofford & Durkee LLP

(57) ABSTRACT

A molecular clock which utilizes a rotational spectrum of gaseous molecules in a sub-THz region for clock stabilization is described. The molecular clock has a fast start-up characteristic and is also robust against mechanical vibration or variation of electromagnetic field. Also described is a chip-scale implementation of a molecular clock. In an embodiment, a molecular clock chipset only consumes a DC power of 66 mW. While providing a highly stable, compact and energy efficient time generator of portable devices.

19 Claims, 25 Drawing Sheets

(51) Int. Cl.
H03J 7/00 (2006.01)
H03L 7/197 (2006.01)

(56) References Cited

U.S. PATENT DOCUMENTS

| | | | | |
|---|---|---|---|---|
| 2,695,361 | A * | 11/1954 | Norton | H03L 7/26 331/3 |
| 2,811,644 | A * | 10/1957 | Norton | H03L 7/26 331/2 |
| 5,838,206 | A | 11/1998 | Busca et al. | |
| 5,892,250 | A * | 4/1999 | Yoshida | H01L 27/0207 257/202 |
| 10,493,722 | B2 * | 12/2019 | Fruehling | H04B 1/38 |
| 2007/0247241 | A1 | 10/2007 | Braun et al. | |
| 2010/0111750 | A1 | 5/2010 | Touchberry et al. | |
| 2016/0190670 | A1 | 6/2016 | Carmon et al. | |
| 2016/0291549 | A1 * | 10/2016 | Herbsommer | G01N 29/36 |
| 2018/0159547 | A1 * | 6/2018 | Herbsommer | H03L 7/26 |
| 2019/0072447 | A1 * | 3/2019 | Cook | G01L 11/00 |
| 2019/0204786 | A1 * | 7/2019 | Herbsommer | H03L 7/26 |

OTHER PUBLICATIONS

Bottom; "A History of the Quartz Crystal Industry in the USA"; Proceedings of the 35th Annual Frequency Control Symposium; pp. 3-12; May 1981; IEEE; 15 Pages.

Camparo; "The rubidium atomic clock and basic research"; 2007 American Institute of Physics; S-0031; Nov. 2007; 12 Pages.

Cox; et al.; "Zeeman Effect of Some Linear and Symmetric-Top Molecules"; Physical Review; vol. 101; No. 4; Feb. 15, 1956; pp. 1298-1304; 7 Pages.

Cyr, et al.; "All-optical microwave frequency standard: a proposal"; IEEE Transactions on Instrumentation and Measurement; vol. 42; No. 2; Apr. 1993; pp. 640-649; 10 Pages.

DeNatale, et al.; "Compact, low-power chip-scale atomic clock"; 2008 IEEE/ION Position, Location and Navigation Symposium; May 5, 2008; pp. 67-70; 4 Pages.

Esnault, et al.; "A compact cold-atom frequency standard based on coherent population trapping"; Frequency Control Symposium (FCS); 2012 IEEE International, May 2012; pp. 1-3; 3 Pages.

Essen, et al.; "An atomic standard of frequency and time interval: a caesium resonator"; 1955 Nature Publishing Group; Aug. 13, 1955; vol. 176; pp. 280-282; 3 Pages.

Essen; "Frequency Standardization"; Proc. IEE—Part II; Power Eng.; Jan. 1951; pp. 154-164; 11 Pages.

Fernández, et al.; "CSAC characterization and its impact on GNSS clock augmentation performance"; Sensors 2017; 17; 370; www.mdpi.com/journal/sensors; Feb. 14, 2017; 19 Pages.

Good; "The inversion spectrum of ammonia"; 1946 American Physical Society; Phys. Rev. 70; 213; Aug. 1, 1946; http://courses.washington.edu/phys432/NH3/ammonia_inversion.pdf; 22 Pages.

Haesler, et al.; "The integrated swiss miniature atomic clock"; 2013 Joint IEEE Ultrasonics, Ferroelectrics and Frequency Control Society (UFFC), European Frequency and Time Forum (EFTF), and Piezoresponse Force Microscopy (PFM) Symposium; pp. 579-581; 2013 IEEE; 3 Pages.

Hershberger, et al.; "servo theory applied to frequency stabilization with spectral lines"; Journal of the Franklin Institute; vol. 249; Issue 5; May 1950; pp. 359-366; 8 Pages.

Jet Propulsion Laboratory; Molecular Spectroscopy Catalog; https://spec.jpl.nasa.gov/; p. 2018.

Koshelev, et al.; "Speed dependence of collisional relaxation in ground vibrational state of OCS: Rotational behavior"; The Journal of Chemical Physics 136; Mar. 30, 2012; 12 Pages.

Lutwak; "The chip-scale atomic clock—recent developments"; 2009 IEEE International Frequency Control Symposium Joint with the 22nd European Frequency and Time Forum; Apr. 20, 2009; pp. 573-577; 5 Pages.

Lutwak; "The SA.45S chip-scale atomic clock—early production statistics"; Proceedings of the 43rd Annual Precise Time and Time Interval Systems and Applications Meeting; Nov. 14, 2011; pp. 207-220; 12 Pages.

Microsemi; "shock and vibration testing of the SA.45s chip scale atomic clock (CSAC) validation build units"; Aug. 2014; White Paper; 36 Pages.

Microsemi; Quantum™, "SA.54s chip scale atomic clock"; Jan. 2017; Data Sheet; 4 Pages.

Nguyen et. al.; "Towards chip-scale atomic clocks"; 2005 IEEE International Solid-State Circuits Conference (ISSCC); Feb. 7, 2005; Digest of Technical Papers; pp. 84-85; 2 Pages.

Rautian; "The Effect of Collisions on the Doppler Broadening of Spectral Lines"; Soviet Physics Uspekhi; vol. 9; No. 5.; Mar.-Apr. 1967; pp. 701-716; 17 Pages.

Ruffieux, et al.; "A Low-Power Fully Integrated RF Locked Loop for Miniature Atomic Clock"; 2011 IEEE International Sold-Sate Circuits Conference (ISSCC); pp. 48-49; Feb. 21, 2011; 3 Pages.

Supplee, et al.; "Theoretical description of frequency modulation and wavelength modulation spectroscopy"; Applied Optics; vol. 33; No. 27; Sep. 20, 1994; pp. 6294-6302; 9 Pages.

Townes; "Atomic clocks and frequency stabilization on microwave spectral lines"; Journal of Applied Physics; vol. 22; No. 11; Nov. 1951; pp. 1365-1372; 9 Pages.

Vanier, et al.; "On the signal-to-noise ratio and short-term stability of passive rubidium frequency standards"; IEEE Transactions on Instrumentation and Measurement; vol. IM-30; No. 4, Dec. 1981; pp. 277-282; 6 Pages.

Wang, et al.; "Rapid and Energy-Efficient Molecular Sensing Using Dual mm-Wave Combs in 65nm CMOS: A 220-to-320GHz Spectrometer with 5.2mW Radiated Power and 14.6-to-19.5dB Noise Figure"; 2017 IEEE International Solid-State Circuit Conference (ISSCC); Feb. 7, 2017; pp. 18-20; 3 Pages.

Wang, et al.; "Robust sub-harmonic mixer at 340 GHz using intrinsic resonances of hammer-head filter and improved diode model"; Journal of Infared, Millimeter, and Terahertz Waves; Nov. 2017; vol. 38; Issue 11; pp. 1397-1415; 19 Pages.

Wang, et al; "Duel-Terahertz-Comb Spectrometer on CMOS for Rapid, Wide-Range Gas Detection with Absolute Specificity"; IEEE Journal of Solid-State Circuits (JSSC); vol. 52; No. 12; Dec. 2017; pp. 3361-3372; 12 Pages.

Wineland et al.; "Results with the special-purpose ammonia frequency standard"; 31st Annual Symposium on Frequency Control; Jun. 1, 1977; pp. 562-573; 12 Pages.

Wineland et al.; "Special Purpose Ammonia Frequency Standard—A Feasibility Study"; IEEE Transactions on Instrumentation and Measurement; vol. IM-28; No. 2; Jun. 1979; pp. 122-132; 11 Pages.

Youngner, et al.; "A manufacturable chip-scale atomic clock"; Transducers & Eurosensors 2007; The 14th International Conference on Solid-State Sensors, Actuators and Microsystems, Lyon, France; Jun. 10, 2007; pp. 39-44; 2007 IEEE; 6 Pages.

PCT International Search Report dated Mar. 6, 2019 for International Application No. PCT/US2018/067642; 4 pages.

PCT International Written Opinion dated Mar. 6, 2019 for International Application No. PCT/US2018/067642; 5 pages.

Kabourek et al.; "Prague's Emission Fourier Transform Microwave Spectrometer — Design and Preliminary Results"; Radioengineering; vol. 22; No. 4; Dec. 1, 2013; [Retrieved on Feb. 24, 2019]; Retrieved from the Internet: <URL: https://www.radioeng.cz/fulltexts/2013/13_04_1288_1295.pdf>; 8 Pages.

Wang et al.; "High-Stability, Miniature Terahertz Molecular Clock on CMOS"; MTL Annual report; Jul. 2017; [Retrieved on Feb. 24, 2019]; Retrieved from the Internet: <URL: https://mtlsites.mit.edu/annual_reports/2017/circuits.pdf> p. 36; 1 Page.

Wang et al.; "High-Stability, Miniature Terahertz Molecular Clock on CMOS"; MIT Annual Report 2017 ; Jul. 2017; Retrieved on Mar. 19, 2020 from the Internet: <URL: https://mtlsites.mit.edu/annual_reports/ar2017.html>; Circuits & Systems, 222 pages.

* cited by examiner

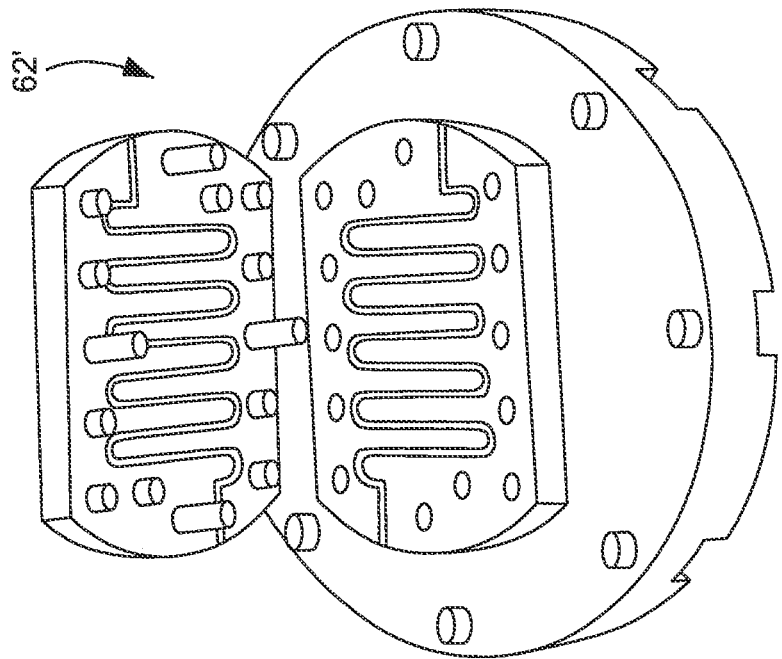
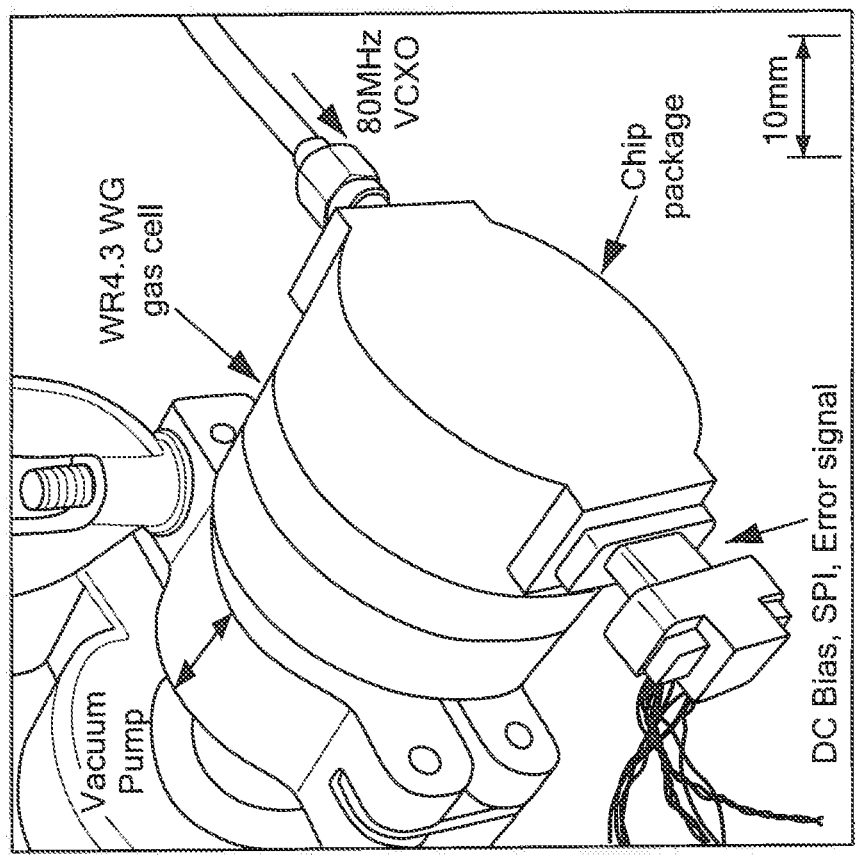
FIG. 9A
FIG. 9

MOLECULAR CLOCK

CROSS-REFERENCE TO RELATED APPLICATIONS

This application claims the benefit of U.S. Provisional Application No. 62/623,214 filed Jan. 29, 2018 which is incorporated by reference herein in its entirety.

GOVERNMENT RIGHTS

This invention was made with Government support under Grant Nos. FA8702-15-D-0001 and PO 7000376241 awarded by the U.S. Air Force, and Grant No. ECCS-1653100 awarded by the National Science Foundation. The Government has certain rights in the invention.

BACKGROUND

As is known in the art, electronic devices (including mobile electronic devices) require highly stable, portable, and energy-efficient reference signal sources which provide a reference signal having a stable output frequency (such reference signal sources are sometimes simply referred to as "reference sources" or "clocks").

Electronic systems in navigation, telecommunication network synchronization and various sensing (e.g. magnetometry) applications typically utilize high performance clocks to help ensure proper operation. The use of a high performance clock is particularly important in equipment which may operate in environments in which a global positioning system (GPS) signal is not available (e.g. underwater sensors). In portable equipment other clock features such as compact size and high energy efficiency become increasingly more important.

Mechanical oscillators, such as crystal oscillators (e.g. quartz crystal oscillators) and microelectromechanical systems (MEMS) oscillator have been widely adopted to fulfill such demands. Although excellent in short-term stability, such mechanical oscillators suffer from long-term frequency drift due to disturbances from the environment, such as temperature variation and mechanical vibration. This leads to instability well beyond the parts per billion ($10^{-9}$) level.

To address such problems, atomic clocks have been used. Atomic clocks lock onto the electron transition frequency of atoms. By locking onto the electron transition frequency of atoms, an atomic clock improves the long-term frequency stability. Outstanding long-term stability may be achieved by atomic clocks, such as those using cesium $^{133}Cs$, rubidium $^{87}Rb$, and hydrogen atoms, which lock the clock signals to electron transition frequencies. Most of these clocks are, however, power hungry and bulky.

Chip-scale atomic clock (CSAC) technology miniaturizes conventional atomic clocks based upon coherent population trapping (CPT). Chip-scale atomic clocks optically probe the hyperfine-state transition of alkali metal atoms and thus can provide excellent long-term stability via a small physical dimension. Using optical coherent population trapping (CPT), chip-scale atomic clocks (CSAC) successfully realized clock miniaturization.

As one example, the SA.45s CSAC achieves a frequency stability (expressed as Allan deviation, ($\sigma_y$) of $3.0 \times 10^{-10}$ for a short-term averaging time $\tau$ of 1 s and $1.0 \times 10^{-11}$ for a long-term $\tau$ of $10^3$ s. It consumes a DC power of 120 mW and occupies a volume of 16 cm$^3$.

However, CSACs involve complicated construction of electro-optic components and hence have a high cost, which hinders their wide applications. The hyperfine transitions used in CSACs is also sensitive to external electric/magnetic fields, which therefore necessitates dedicated shielding in the alkali gas cell for long-term stability. Another disadvantage of such CSACs is the long "start-up" time (~several minutes), which resultant from the alkali-metal evaporation and related thermal stabilization.

Lastly, an electronic servo loop inside a clock typically have a maximum loop bandwidth limited by the absolute linewidth of the spectrum under probing, which is down to kHz-level for CSACs. The resultant low bandwidth (hence slow response time) of the servo loop degrades the capability of correcting fast-changing frequency deviations caused by, for example, clock vibration.

During 1940s to 1970s, the inversion spectrum of ammonia had also been actively exploited as a source of clock references. The inversion of $NH_3$ is essentially vibrational-mode motion, resultant from a Nitrogen atom going through a barrier formed by three Hydrogen atoms under a quantum-mechanical tunneling effect. In 1977, an Allan deviation of $2 \times 10^{-10}$ for $\tau = 10^3$ s was reported by using a spectral line (J–K=3–3) of $NH_3$ at 23.8 GHz. Due to the use of a gas cell waveguide with large dimension (half centimeter for single-mode propagation) and length (due to the weak absorption), miniaturization of ammonia clocks is infeasible. Nevertheless, its fully-electronic operation significantly simplifies the clock implementation. And since ammonia molecules remain in gas phase for a wide temperature range, the clock can be turned on from cold instantaneously, which is critical for many real-time applications. Lastly, the higher loop bandwidth due to larger linewidth enhances the stability of ammonia clock under mechanical vibration and shock.

SUMMARY

In accordance with an aspect of the concepts sought to be protected herein, it has been recognized that advances in silicon microelectronic technology have enabled on-chip integration of millimeter-wave/terahertz (THz) spectroscopic systems. It has also been recognized In accordance with an aspect of the concepts sought to be protected herein that there exist opportunities of realizing low-cost, low-power, miniaturized clocks referencing a set of frequency bases never before used, namely: rotational-state transitions of gaseous polar molecules, and in particular, rotational-state transitions of gaseous polar molecules in the sub-THz region.

Thus, in accordance with the concepts, systems and techniques sought to be protected herein, a molecular clock which utilizes a rotational spectral line of gaseous molecules. Such a clock is able to generate a highly stable clock signal. Such a clock is also capable of achieving frequency stability characteristics which are the same as or similar to those achieved using a chip-scale atomic clock (CSAS). In embodiments, a molecular clock utilizes a rotational spectral line of gaseous molecules in sub-THz region.

Preferably, molecules remain in gas phase under a wide temperature range are used since such molecules do not require no atom evaporation (i.e. a gas cell heater typically utilized in traditional atomic clocks for alkali evaporation, as noted above, is not required). With this approach, a molecular clock which can be instantaneously "turned-on" is provided. This instant turn-on characteristic makes the molecular clock described herein suitable for use in numerous applications which require a real-time response. Eliminating the need for a gas cell heater thus enables a molecular clock having the aforementioned instantaneous "turn-on" feature and also leads to a reduction in size.

In embodiments, a molecular clock provided in accordance with the concepts described herein are able to achieve an absolute line width of about 1 MHz which is on the order of 1,000 times that of a CSAC and has a loop bandwidth of about 100 kHz. Such a relatively wide loop bandwidth results in a molecular clock which is robust under vibration.

Furthermore, due to the use of gaseous molecules having a linear structure within a waveguide gas cell, the molecular clock described herein is insensitive to electromagnetic field variation, which results in hyperfine energy level splitting. A molecular clock having enhanced robustness to electric/magnetic-field disturbance and a high-speed close-loop adjustment of frequency error, results in a clock having a timing stability which is higher than conventional clocks.

Lastly, in an embodiment, complementary metal oxide semiconductor (CMOS) technology may be used to provide a chip-scale integrated molecular clock.

In accordance with a further aspect of the concepts described herein, a rotational-mode molecular clock based upon the absorption spectrum of carbonyl sulfide ($^{16}O^{12}C^{32}C$) is described. In one embodiment, Allan deviations of $2.2 \times 10^{-11}$ for an averaging time of $\tau=10^3$ s were measured by probing a harmonic of the carbonyl sulfide spectral dispersion curve.

In an embodiment, a 65-nm complementary metal-oxide-semiconductor (CMOS) silicon integrated circuit (IC) molecular clock (i.e. a molecular clock chip) is coupled to a waveguide gas cell. In an embodiment, the CMOS IC is provided as a 65-nm CMOS IC and the waveguide gas cell is provided as a compact sub-THz waveguide gas cell having a measured Allan deviation $\sigma_y$ of $3.8 \times 10^{-10}$ ($\tau=10^3$ s) and a DC power consumption of 66 mW. These results demonstrate a monolithic integration of an "atomic-clock-grade" frequency reference in mainstream on-chip systems used in a variety of different applications including, but not limited to, navigation, communication and sensing applications (that is, using a molecular clock provided in accordance with the concepts describe herein an "atomic-clock-grade" frequency reference source may be embedded in standard electronic systems on a monolithic silicon chip with an external gas cell coupled thereto).

In view of the above it should now be appreciated that a new physical mechanism—i.e. a rotational spectrum of linear polar molecules may be utilized for clock generation (e.g. carbonyl sulfide $^{16}O^{12}C^{32}S$, for example in sub-THz region of 200~300 GHz). It should, of course, be appreciates that other gaseous molecules having a linear structure may be used and that operation in other RF frequency ranges (e.g. frequency ranges below 200 GHz) is possible and in some applications may be preferred or even necessary.

In contrast to the hyperfine transitions used in conventional atomic clocks, the rotational spectral lines of OCS can be probed in a fully-electronic manner and have a low g-factor of about 0.03 (as opposed to g-factor of about 2 for conventional atomic clocks). Hence, molecular clocks provided in accordance with the concepts described herein are more robust to external magnetic field than conventional clocks.

Furthermore, compared to ammonia clocks, molecular clocks described herein have a resonance with a higher quality factor and absorption intensity, which enables better short-term frequency stability. In addition, because of the much smaller wavelength of sub-THz signal, the volume of the gas cell required by molecular clocks described herein is reduced to volume levels in the range of cubic centimeters ($cm^3$), thereby resulting in a clock which occupies an area/volume which is small compared with area/volume occupied by conventional clocks having similar performance characteristics (i.e. the concepts described herein result in clock miniaturization).

Also described are studies for the rotational spectrum of OCS and two clock prototypes. In an instrument-based molecular clock prototype, utilizing a high order harmonic dispersion curve of a rotational spectral line, an Allan deviation comparable with that of a CSAC and ten (10) times better than that achieved with ammonia clocks has been measured. The molecular clocks described herein also share the fast "start-up" feature of ammonia clocks, since OCS also keeps gas phase above −50° C. In one embodiment, the achieved time-domain response of a molecular clock provided in accordance with the concepts described herein is 1000 times faster than a CSAC, which results in excellent frequency stability even under a vibrating environment as well as other environments.

BRIEF DESCRIPTION OF THE DRAWINGS

The foregoing features may be more fully understood from the following description of the drawings in which:

FIG. 9 is an illustration of a packaged CMOS molecular clock module;

FIG. 9A is a isometric view of an illustrative waveguide gas cell;

DETAILED DESCRIPTION

Before describing a molecular clock which utilizes a rotational spectral line of gaseous molecules to generate a reference signal, some introductory information is provided. Reference is sometimes made herein to a waveguide gas cell operable with a carbonyl sulfide compound (OCS). It should be appreciated that such reference is made only to promote clarity in the description of the concepts sought to be protected and are not intended to be and should not be construed as limiting. Those of ordinary skill in the art will appreciate that the molecular clock described herein may be implemented via any gas with molecules having a rotational spectrum of linear polar molecules. Reference is also sometimes made herein to $^{16}O^{12}C^{32}S$. Again, such reference is made only to promote clarity in the description of the broad concepts described herein. After reading the description herein, those of ordinary skill in the art will appreciate that that other isotopes, may of course, also be used. For example, alternative isotopes include, but are not limited to $^{16}O^{12}C^{33}S$, $^{16}O^{12}C^{34}S$, $^{16}O^{13}C^{32}S$ and $^{18}O^{12}C^{32}S$.

Figure 1:
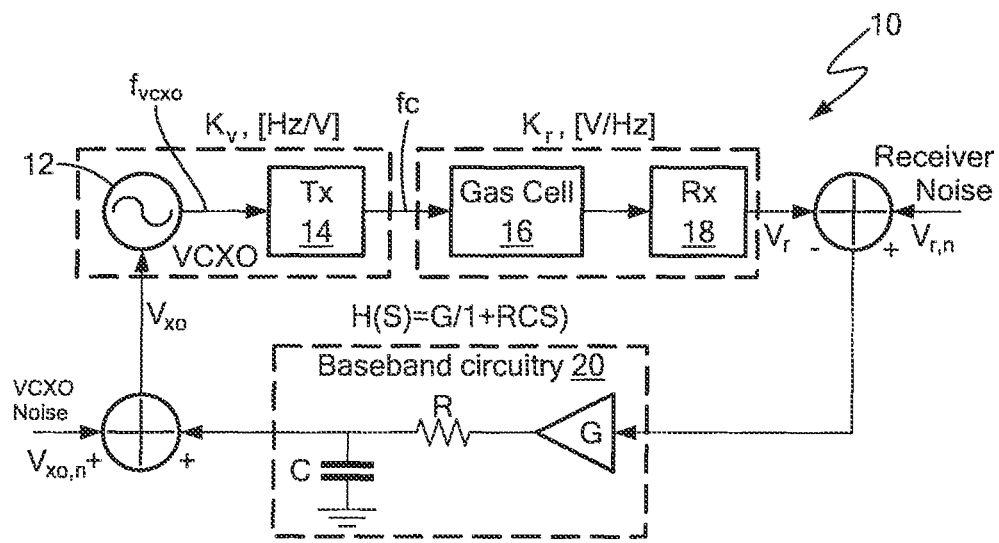
FIG. 1 is a block diagram of a molecular clock locking to a zero-crossing point of a dispersion curve (FIG. 1A)
Figure 1A:
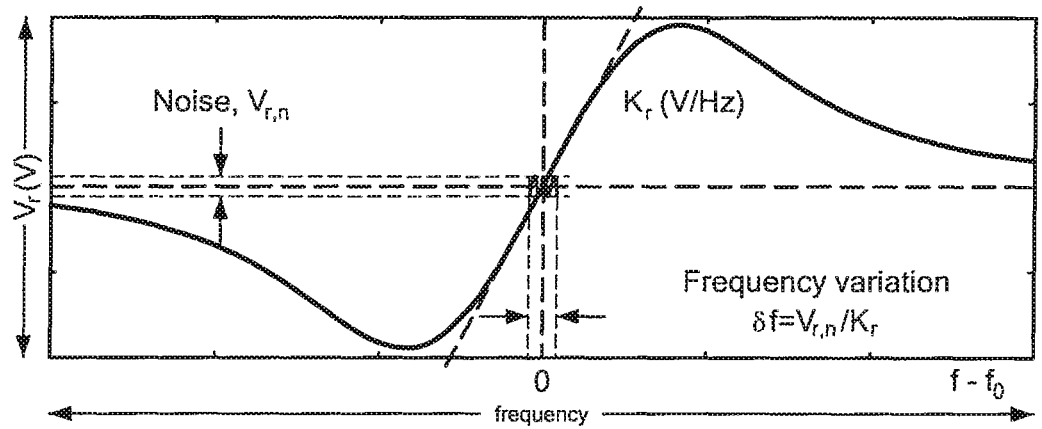
FIG. 1A is a plot of a dispersion curve.

Referring now to FIG. 1, a molecular clock 10 includes a radio frequency (RF) signal source 12 (here illustrated as a voltage-controlled crystal oscillator (VCXO) which provides a clock signal having a frequency $f_{vcxo}$ at an output thereof.). The phase noise of signal source 12 is represented as a noise source ("VCXO Noise") having an input referred noise spectrum density denoted as $V_{xo,n}$. Signals from the noise source and baseband circuitry, having a transfer characteristic as shown in FIG. 1A, are combined to produce a signal $V_{xo}$ which is provided to the RF signal source VCXO.

The signal source 12 provides an RF signal having a frequency fvcxo to a transmitter circuit (Tx) 14 which may process the signal provided thereto by amplifying, frequency shifting (e.g. upconverting or multiplying and/or downconverting), or otherwise processing the RF input signal provided thereto. Transmitter circuit Tx provides an RF transmit signal a frequency fc at an output thereof. An output port of the transmitter circuit Tx is coupled to an RF input of a gas cell 16. An illustrative gas cell will be described in detail herein below. Suffice it here to say that gas cell utilizes gaseous molecules having a linear structure such that the molecular clock utilizes a rotational spectral line of such gaseous molecules to generate a reference signal having a high degree of stability as will become apparent from the description herein below.

A molecular clock utilizing rotational spectral lines of gaseous molecules is capable of achieving frequency stability characteristics which are the same as or similar to those achieved using a chip-scale atomic clock (CSAS). In embodiments to be described below, a molecular clock utilizes a rotational spectral line of gaseous molecules in the sub-THz region. It should of course be appreciated that frequencies selected from other than the sub-THz frequency range (e.g. higher or lower than the sub-THz range) may also be used. It should be appreciated that one may choose to provide a molecular clock in the sub-THz range to achieve a relatively compact gas cell (since the size of the gas cell is proportional to the wavelength). It should, however, also be appreciated that the rotational lines distribute from the microwave to the THz frequency range (GHz~THz) and most frequencies have the potential to be used in the clock.

Preferably, molecules which remain in gas phase under a wide temperature range are used since such molecules do not require atom evaporation (e.g. a gas cell heater typically utilized in conventional atomic clocks for alkali evaporation, as noted above, Is not required). Rather with the approach described herein, a molecular clock which can be instantaneously "turned-on" is provided. This instant turn-on characteristic makes the molecular clock described herein suitable for use in numerous applications which require a real-time response. Thus, eliminating the need for a gas cell heater enables a molecular clock having the aforementioned instantaneous "turn-on" feature and also leads to a reduction in size.

In embodiments, a molecular clock provided in accordance with the concepts described herein are able to achieve an absolute line width of about 1 MHz which is on the order of 1,000 times that of a CSAC and has a loop bandwidth of about 100 kHz. Such a relatively wide loop bandwidth results in a molecular clock which is robust under vibration.

An RF output of the gas cell is coupled to an input of an RF receiver circuit (Rx) 18. Receiver circuit Rx receives RF signals from the gas cell, appropriately processes (e.g. down-converts or detects e.g. via a square law detector) the RF signals provided thereto and provides a receiver output signal (e.g. a baseband signal) at an output thereof. It should be noted that there are two possible configuration for the receiver RX. One for heterodyne detection, which needs mixing with an external local oscillator, and another for square-law detection, which performs just self-mixing. In the illustrative embodiment of FIG. 1, the receiver Rx implements square law detection (thus no local oscillator signal is required). The receiver output signal (e.g. an intermediate frequency (IF) signal) includes receiver noise which is here schematically illustrated as being added to the receiver output signal via a receiver noise source. The receiver output signal is provided to a baseband circuit 20 where the signal is gain adjusted and filtered (here with a low pass filter characteristic) and fed back to signal source 12.

In one illustrative embodiment, a sub-THz signal is generated by the VCXO (which may include, for example, a frequency multiplier chain). The receiver receives the signals fed thereto and generates a signal having a frequency corresponding to frequency difference between the carrier frequency of a probing signal $f_c$ and $f_0$ which signal is converted to an error signal $V_r$. Frequency locking is then established by feeding the error signal $V_r$ back to an input of the VCXO after amplification (with gain of G) and low-pass filtering via baseband circuit 20. Thus, the open loop gain at DC denoted as $G_{DC}$ may be determined as:

$$G_{DC}=K_v \cdot K_r \cdot G >> 1 \quad (\text{Eq. 1})$$

In which:

$K_v$ is the transfer response of the signal source VCXO and transmitter circuit;

$K_r$ is the $K_r$ is the slope at the zero-crossing point (FIG. 1A, f–f0=0), which stands for the sensitivity of the system to the frequency deviation between the spectral line center and current clock frequency; and G corresponds to the baseband gain.

It should be noted that there exists two major noise sources in the system of FIG. 1: (1) the phase noise of VCXO with an input referred noise spectrum density of $V_{xo,n}$; and (2) the noise of sub-THz transceiver with a noise spectrum density of $V_{r,n}$. Both of the noise sources are reduced (and ideally, entirely suppressed) by the open loop gain $G_{DC}$ after locking, if located within the loop bandwidth. By assuming that the noise spectrum density $V_{r,n}$ dominates, the short-term Allan deviation $\sigma_y$ of the molecular clock may be expressed by the slope of measured dispersion curve $K_r$ and the noise spectrum density $V_{r,n}$ as follows:

$$\sigma_y(\tau) = \frac{V_{r,n}}{\sqrt{2\tau} \cdot K_r \cdot f_0} \approx \frac{K_N}{Q \cdot SNR \cdot \sqrt{\tau}}, \quad (\text{Eq. 2})$$

In which:

$\tau$ is the averaging time;

$f_0$ represents the spectral line center;

$K_N$ is a constant, which depends upon the selected harmonics (e.g. if the fundamental dispersion (N=1) is selected, $K_N \approx 0.2$);

Q is a quality factor of the spectral line; and

SNR is the signal to noise ratio of the spectral line.

The quality factor of spectral line is defined as $Q=f_0/FWHM$, where $f_0$ is the center frequency and FWHM is the full width at half maximum. The quality factor is determined by several mechanisms including, but not limited to: (1) the natural linewidth, due to disturbance of zero-point vibration of electromagnetic fields, is around 0.1 Hz ($Q \approx 10^{12}$) for the sub-THz band; and (2) under low pressure, Doppler effect from the Brownian motion causes spectral-line broadening.

As shown in Equation (2), by assuming a Lorentz line profile, the short term Allen deviation $\sigma_y$ can also be expressed as the product of quality factor Q and SNR. For a fundamental dispersion curve, $K_1 \approx 0.2$. Thus, there exists a concomitant relationship between the value of the SNR-quality factor Q product and short-term frequency stability. Specifically, the higher the value of the product of SNR and quality factor Q, the better the short-term frequency stability characteristic of the clock signal.

In addition, the SNR decreases by 6 dB as the harmonic number N increases by 2, due to the reduction of signal amplitude of the harmonic vis-à-vis the amplitude of the fundamental. Thus, a molecular clock locking to the fundamental dispersion curve produces a clock signal having a short-term stability characteristic which is better than a short-term stability characteristic of a clock signal produced by a molecular clock locking to a harmonic dispersion curve.

However, high order harmonic dispersion curves are also not trivial, which exhibit better long-term stability due to the improved symmetry. In general, the symmetry of the spectral line is negatively affected by the frequency non-flatness of the probing system (i.e. the transmitted (TX), receiver (RX) and gas cell), which will deteriorate the long-term stability of the clock due to environment variations. However, fortunately, the non-flatness of the probing system is much smoother than the absorption of spectral line. As a result, locking onto a high order dispersion curve instead of the fundamental dispersion curve, the effect of mentioned non-flatness will be reduced, but the signal from spectral line itself still stays significant. Then, better long-term stability is expected.

Figure 2:
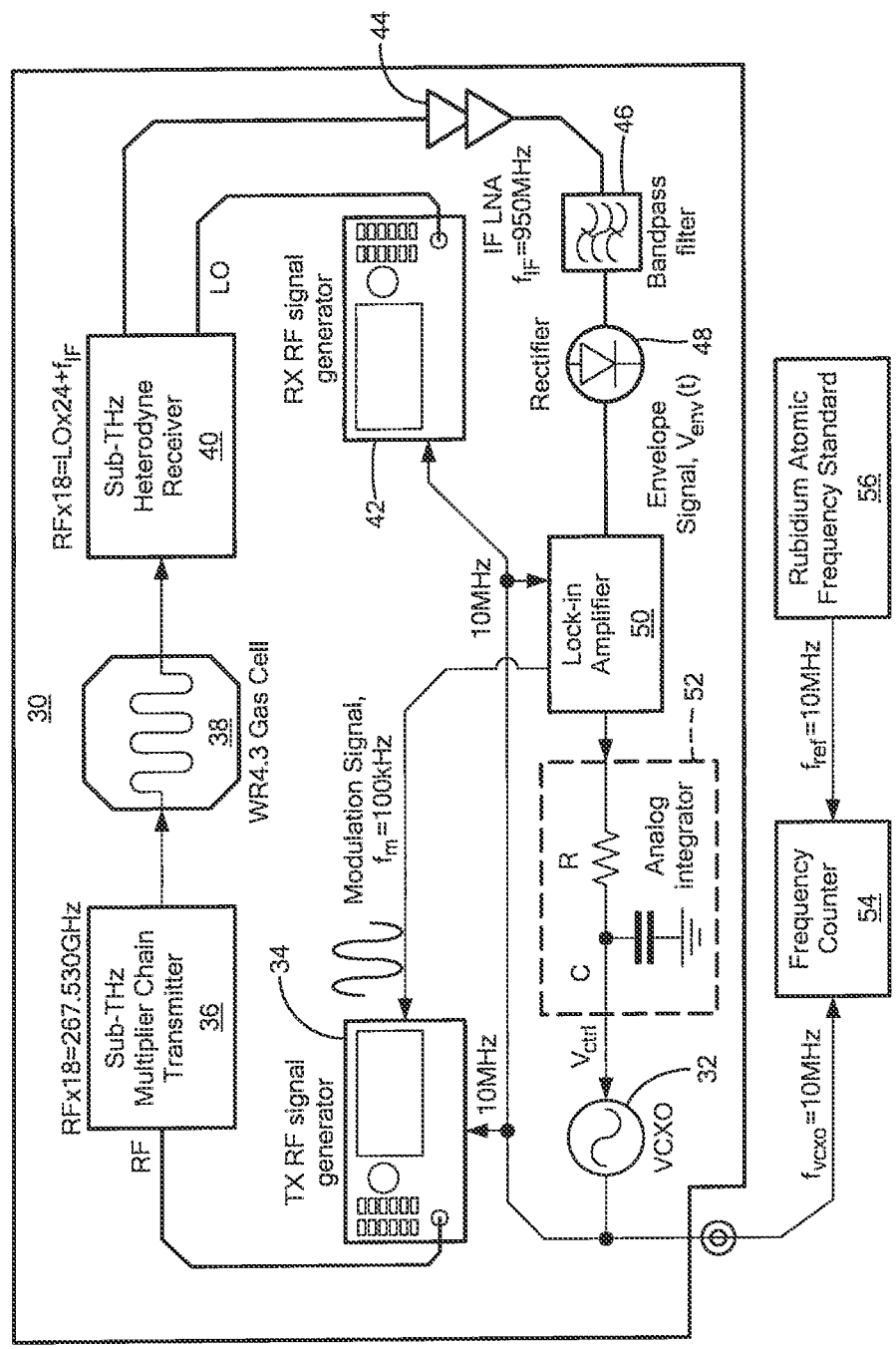
FIG. 2 is a block diagram of a molecular clock.

Referring now to FIG. 2, an illustrative embodiment of a molecular clock 30 includes a voltage controlled crystal oscillator 32 (VCXO) which generates a 10 MHz reference signal and provides the reference signal to an input of a transmit RF signal generator 34 (i.e. an RF transmit signal source). The RF transmit signal source provides an RF output signal to the input of a multiplier (or upconverter) circuit 36 (which may, for example be implemented as a so-called multiplier chain). Multiplier circuit receives the RF signal provided thereto from the RF source at a first frequency and provides at an output thereof a second RF signal at a higher frequency (i.e. a multiple of the frequency of the RF input signal). In embodiments, the multiplier chain transmitter fed by the VCXO generates an output signal having a frequency in the sub tera Hertz (sub-THz) frequency range.

The output of the multiplier chain transmitter is coupled to an input of a waveguide gas cell 38. In one embodiment, the waveguide gas cell is provided as a rectangular waveguide appropriate for operation in the sub-THz frequency range (e.g. a WR4.3 gas cell). The waveguide gas cell includes a gas inlet/outlet through which waveguide gas cell receives molecules having a rotational spectrum of linear polar molecules.

An example of one such molecular structure is a carbonyl sulfide compound (OCS) having a rotational spectrum of linear polar molecules in millimeter-wave and terahertz frequency ranges. An OCS has a characteristic of having a low temperature coefficient and robustness against external magnetic fields. In one embodiment, a carbonyl sulfide compound having a rotational spectrum of linear polar molecules in the sub-terahertz (THz) frequency range is used. In one illustrative embodiment, the rotational spectral line (J=19←18, $f_0$=231.060983 GHz) of OCS is chosen. In other embodiments, other gases may be used including but not limited to $CH_3CN$, $SO_2$, $H_2O$ and HCN.

As will be described in detail further below in conjunction with FIG. 11, when rotating, the linear OCS molecule can be approximated as a rigid rotor with quantized rotational energy levels (indicated by quantum number J). For the transition from energy state J to J+1, the frequency of incident photon should be $f_{J+1 \leftarrow J} = 2B_{OCS}(J+1)$, where $B_{OCS}$ (≈6.081 GHz) is the rotational constant of OCS. Therefore, the rotation spectrum of OCS comprises of a set of absorption spectral lines with an equal frequency spacing of $2B_{OCS}$.

In general, rotational spectral lines of OCS in a gas cell are described in conjunction with FIGS. 5, 5C and 13-18.

It should be appreciated that due to the use of gaseous molecules having a linear structure within a waveguide gas cell, the molecular clock described herein is substantially insensitive to electromagnetic field variation, which results in hyperfine energy level splitting. A molecular clock having enhanced robustness to electric/magnetic-field disturbance and a high-speed close-loop adjustment of frequency error, results in a clock having a timing stability which is higher than conventional clocks.

An output of the waveguide gas cell is coupled to an RF input of a sub-THz heterodyne receiver 40. In this illustrative embodiment, an Rx RF signal generator 42 provides a local oscillator (LO) signal to an LO input of the receiver. Thus, the transmitter provides an RF signal to an RF input of the sub-THz heterodyne receiver (e.g. via the waveguide gas cell) and the Rx RF signal generator provides an LO signal to the LO input of the sub-THz heterodyne receiver. In response to the signals provided thereto, the sub-THz heterodyne receiver provides an intermediate frequency (IF) signal at an IF output thereof.

The IF signal produced by the sub-THz heterodyne receiver has a frequency corresponding to a frequency difference between the frequency of the RF signal (designated $f_c$) and the frequency of the LO signal (designated $f_0$). The IF signal is converted to an error signal $V_r$.

The IF output of the sub-THz heterodyne receiver is coupled to an IF low noise amplifier 44 which amplifies the signal provided thereto and provides a suitably amplified signal at the IF frequency to a bandpass filter 46 which appropriately filters the amplified IF signal. The filtered IF signal is then provided to a detector 48 (which may comprise a rectifier, for example). The detector produces and envelope signal which is coupled to an of a lock-in amplifier 50.

The lock-in amplifier also receives a portion of the 10 MHz clock signal from the VCXO. In response to the signals provided thereto, the lock-in amplifier generates a modulation signal (here having a frequency of about 100 kHz—i.e. $f_m$=100 kHz) and which is provided to both an input of the Tx RF signal generator and to an analog integrator 52 which integrates the signal provided thereto and provides a control signal $V_{ctrl}$ to a control terminal of the VCXO.

Frequency locking is thus established by feeding the error signal $V_r$ back to the crystal oscillator signal source VCXO after amplification with a low noise amplifier (LNA) having a gain of G and appropriate filtering (e.g. using a filter having a low-pass or a band-pass filtering characteristic to improve frequency selectivity by significantly attenuating signals at frequencies other than the IF frequency). It should be appreciated that the illustrative embodiment of FIG. 2 corresponds to a clock prototype, which adopts a filter having a band pass filter characteristic (i.e. a BPF) for IF frequency and a filter having filter having a low pass filter characteristic (i.e. a LPF) for baseband.

Figure 3:
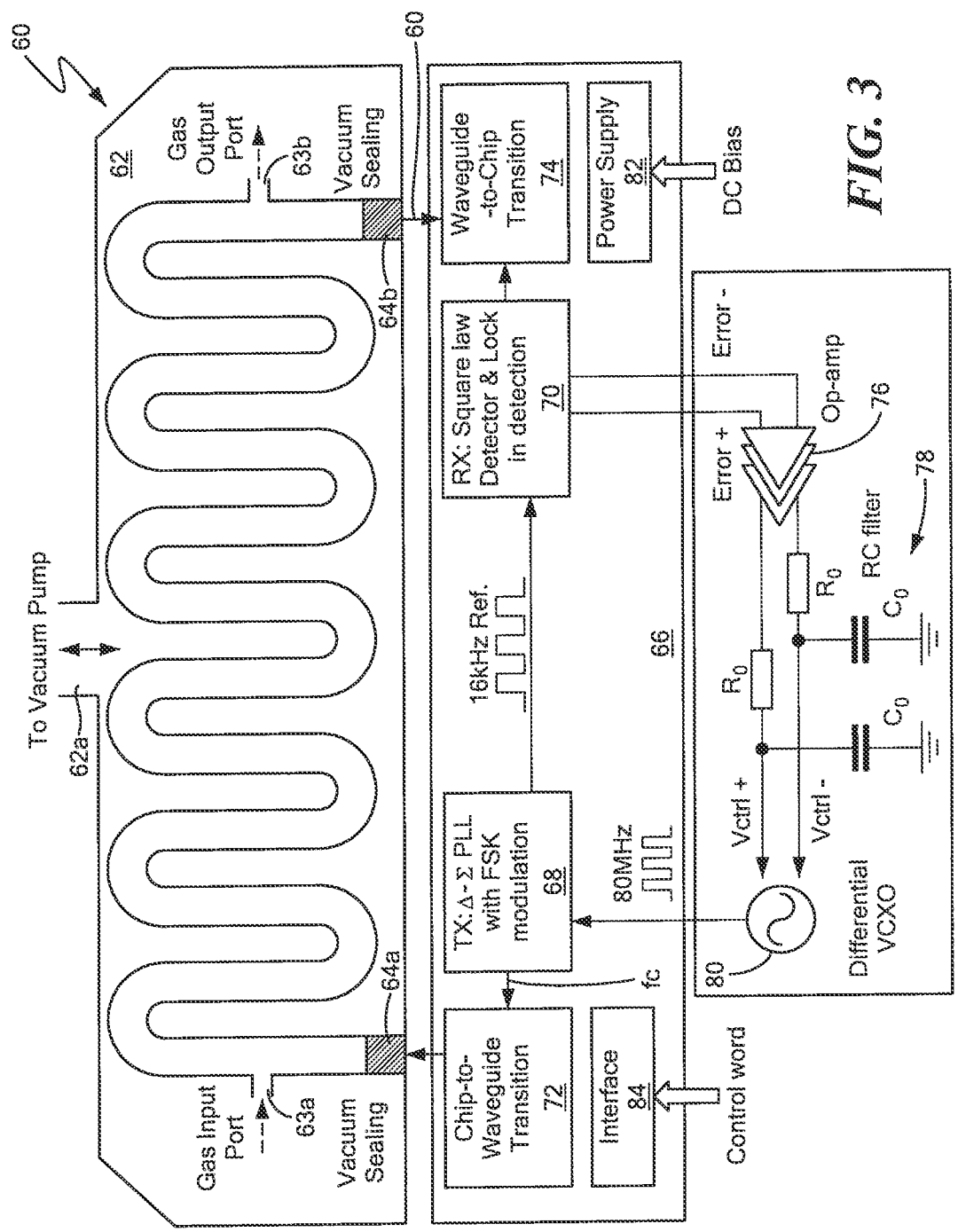
FIG. 3 is a block diagram of a molecular clock.

The illustrative embodiment of FIG. 3 on the other hand, corresponds to a chip-scale prototype, which only requires a low pass filter. With this configuration, (and as noted above), the open loop gain at DC may be expressed as:

$$G_{DC} = K_v \cdot K_r \cdot G \gg 1 \quad \text{(Eq. 1)}$$

in which:
$K_v$ is a transfer response of the transmitter (Tx);
$K_r$ is a transfer response of the receiver (Rx); and
$K_r$ is the slope of a measured dispersion curve (e.g. as shown in FIG. 1A).

To test the stability of the VCXO output signal, (i.e. the clock signal) a portion of the VCXO output signal s coupled to a first input port of a frequency counter 54 and a second input port of the frequency counter is coupled to receive a reference signal Vref having a frequency of 10 MHz from a Rubidium atomic frequency standard signal source 56. In embodiments, an instantaneous frequency may be obtained using a frequency counter with a total measurement time of 4000 s (e.g. as shown in FIG. 10A).

Referring now to FIG. 3 a molecular clock 60 includes a waveguide gas cell 62 having a gas inlet/outlet 62a configured to be coupled to a vacuum pump or any other a device capable of removing gas molecules from a sealed volume in order to leave behind a partial vacuum. The waveguide gas cell is configured to receive gas molecules having a rotational spectrum of linear polar molecules such as any of the types described herein. One example of such a molecular structure is a carbonyl sulfide compound (OCS) having a rotational spectrum of linear polar molecules in millimeter-wave and terahertz frequency ranges. In one embodiment, a carbonyl sulfide compound having a rotational spectrum of linear polar molecules in the sub-terahertz (THz) frequency range is used. In one illustrative embodiment, the rotational spectral line (J=19←18, $f_0$=231.060983 GHz) of OCS is chosen. As noted above, in other embodiments, other molecules may be used. The factors to be considered in selecting a specific molecule to use in a specific application include, but are not limited to: stability under environment disturbances (for long-term stability), sparsity of the adjacent spectral line (for symmetry), absorption intensity (for SNR) and frequency (for hardware implementation). After reading the disclosure provided herein, one of ordinary skill in the art will appreciate how to select an appropriate molecule and transition lines to suit the needs of a particular application.

The waveguide gas cell also include a gas inlet port 63a at which gas molecule are enter the waveguide gas cell and a gas outlet port 63b at which gas molecule exit the waveguide gas cell. The waveguide gas cell also includes an RF input port and an RF output port 64a, 64b each having vacuum seal structures provided therein such that gas enter or exit the waveguide cell through the waveguide cell RF input and output ports.

The molecular clock further includes a CMOS integrated circuit 66 (i.e. a chip) comprising a transmitter 68 and a receiver 70 (and hence the transmitter and receiver are provided as CMOS circuits). An output of the transmitter is coupled to the RF input port of the waveguide gas cell through a chip-to-waveguide transition 72. Similarly the RF output port of the waveguide gas cell is coupled to an input of the receiver through a chip-to-waveguide transition 74. In this illustrative embodiment, the transmitter includes a delta-sigma phased lock loop (PLL) with FSK modulation and the receiver includes a square law detector and lock-in detection circuitry.

In an embodiment, the transmitter provides a reference signal to the receiver (here illustrated as having a frequency of 16 KHz) and the receiver receives the RF signal from the waveguide gas cell. In response to the signals provided thereto, the receiver produces an IF signal having a frequency corresponding to a frequency difference between the frequency of the RF signal (designated $f_c$) and the frequency of the signal provided thereto from the waveguide gas cell (designated $f_0$).

The IF signal is converted to a differential error signal+/−$V_r$ and is coupled to an amplifier 76 (here illustrated as an operation amplifier (or Op-Amp) which amplifies the signal provided thereto and provides a suitably amplified signal at the IF frequency to a filter 78 (which may have, for example, a low pass or a band pass filter characteristic). The appropriately amplified and filtered signal is then provided to differential control terminals and differential crystal oscillator signal source (VCXO) 80 which in turn provides a feedback signal to the transmitter. Here, the feedback signal corresponds to an 80 MHz pulse train. Frequency locking is thus established by feeding the error signal $V_r$ produced by the receiver back to the differential VCXO after appropriate amplification and filtering.

The molecular clock further includes a DC bias signal input through which a DC bias signal is provided to a power supply 82. The power supply provides power to the CMOS circuits (e.g. the transmitter and receiver) as is generally known.

The molecular clock further includes a control word signal input through which a digital control word (e.g. a steam of digital bits) are provided through an interface 84 (e.g. an SPI) to digitally controllable circuits and components (e.g. the transmitter and receiver and various components thereof). The frequency of the clock is controlled by the phase-locked loop, which in some embodiments can be adjusted with the 40-bit resolution. In other embodiments, higher or lower resolution may be used (i.e. higher or lower than 40-bit resolution).

In embodiments the CMOS chip package may be implemented in silicon using a conventional 65 nm low power CMOS process. In embodiments the feedback circuit and/or the gas cell may also be provided as part of the integrated circuit.

Figure 4:
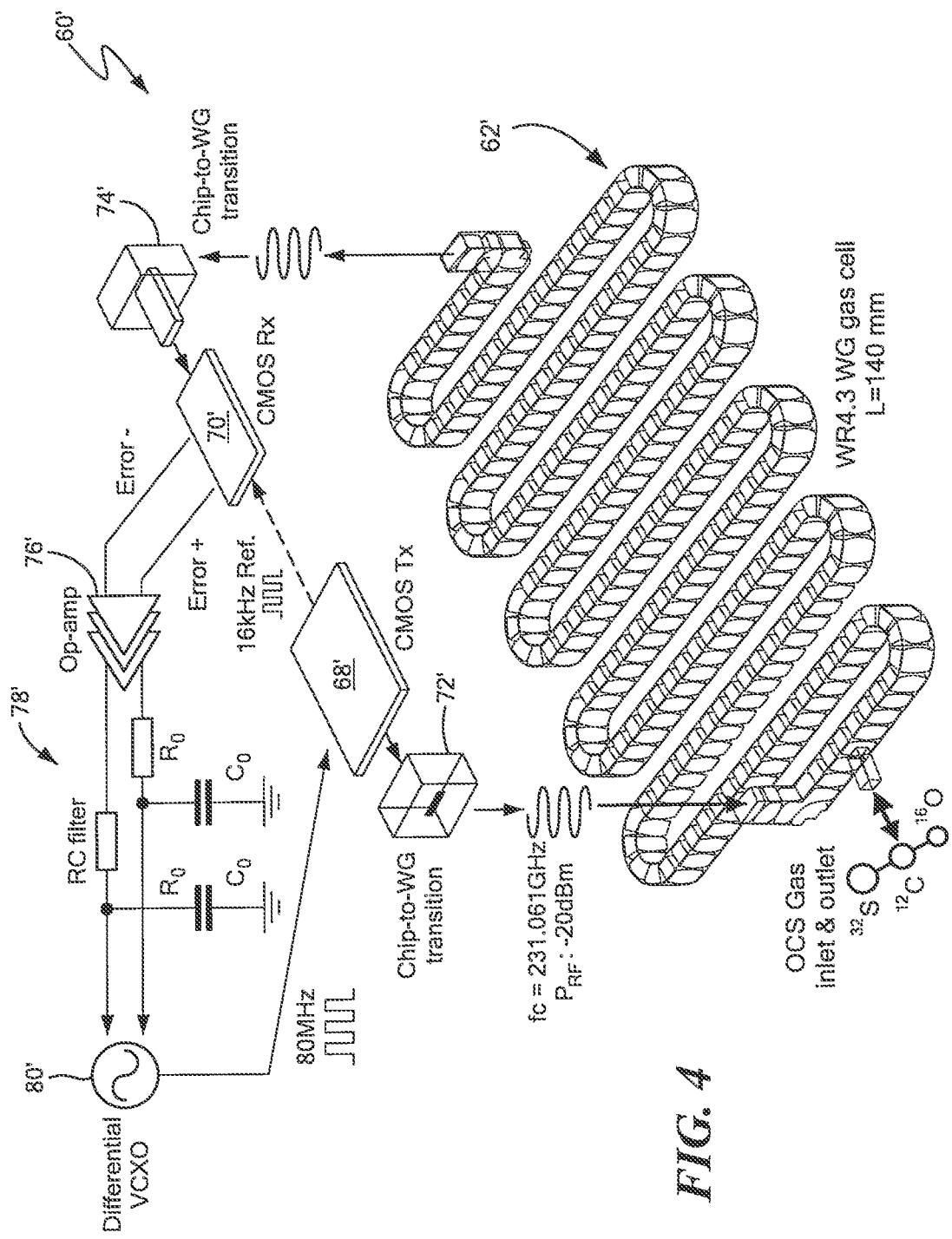
FIG. 4 a block diagram of a molecular clock.

Referring now to FIG. 4, a molecular clock 90 which may be the same as or similar to the molecular clock described above in conjunction with FIG. 3 is shown. The illustrative molecular clock of FIG. 4 corresponds to a complementary metal-oxide-semiconductor (CMOS) a molecular clock.

In this illustrative embodiment, the waveguide gas cell contains a carbonyl sulfide compound (OCS) having a rotational spectrum of linear polar molecules in the millimeter through sub-terahertz (THz) frequency ranges. In the illustrative embodiment, the rotational spectral line (J=19←18, $f_0$=231.060983 GHz) of OCS is chosen. In other embodiments, other gases may be used including but not limited to $CH_3CN$, $SO_2$, $H_2O$ and HCN.

In this illustrative embodiment, the OCS gas sample is contained inside a WR4.3 waveguide gas cell 62', having a length (L=140 mm) selected to achieve a signal-to-noise (SNR) ratio within a desired range of SNR's. Those of ordinary skill in the art, after reading the disclosure provided herein will appreciate how to select such a range. In embodiments, the length of the waveguide gas cell is selected to achieve a maximum or near maximum or optimized SNR. Those of ordinary skill in the art, after reading the disclosure provided herein, will also understand how to select an appropriate waveguide gas cell (e.g. cross-section sectional shape, length, width height, etc. . . . ) for use in a particular application.

In the example of FIG. 4, a probing signal from a transmitter Tx ($f_C$=231.061 GHz) is modulated via a frequency-shift-keying (FSK) technique with modulation frequency $f_m$ of 16 KHz (i.e. $f_m$=16 KHz) and a frequency deviation Δf of 1 MHz (i.e. Δf=1 MHz). The intensity of two sidebands of the FSK signal is then shaped by the line profile ("shaped meaning being determined by the absorption of the line profile). Therefore, any frequency errors (defined as the frequency difference between the frequency of the transmitter signal $f_C$ and the frequency of the local oscillator signal $f_O$ provided to the receiver CMOS—i.e. $f_C$-$f_O$) will cause envelope fluctuation with a period of 1/$f_m$ due to imbalance of two sidebands.

The frequency error is converted to the error voltage by a square-law detector and lock-in detector at a frequency of $f_m$ in the receiver Rx. After amplification and integration, a feedback signal is provided to the differential voltage controlled crystal oscillator (VCXO) of the transmitter Tx to establish a dynamic frequency compensation system. It should be appreciated that the transmitter TX in FIG. 1 may substantially refer to TX RF generator 34 and multiplier chain 36 of FIG. 2. It also refers to DSM PLL with FSK modulation. However, as is apparent from the descriptions provided herein, the transmitters TX of FIG. 2 and FIG. 3 are different. However, they serve for the same purpose of providing a probing signal at a desired frequency (e.g. a probing signal having a desired frequency in the GHz-THz frequency range).

In an illustrative embodiment, an RF power of 50 μW and OCS pressure of 10 Pascal are chosen to maximize short-term frequency stability of the molecular clock. In such an embodiment, measured FWHM and peak absorption may be about 1.548 MHz and 36.9%, respectively.

As evident from FIGS. 3 and 4 it is appreciated that transmit Tx and receive Rx integrated circuits (or "chips"), may be implemented on the same chip or independently. Transmit Tx and receive Rx integrated circuits (or "chips"), may be implemented independently to avoid direct coupling path of sub-THz signal on chip. The direct coupling path results in DC level shifting of the dispersion curve and eventually leads to frequency error. For higher energy efficiency, 231.060983 GHz spectral line (J=19←18) of OCS is chosen. Thus, a 224~242 GHz, 40-bit Δ-Σ fractional-N phase-locked loop (PLL) with a frequency resolution of $10^{-12}$ is designed for a transmitter Tx. The PLL also performs frequency-shift-keying (FSK) modulation for WMS, with $f_m$ of 16 kHz and Δf of 1 MHz.

Figure 5:
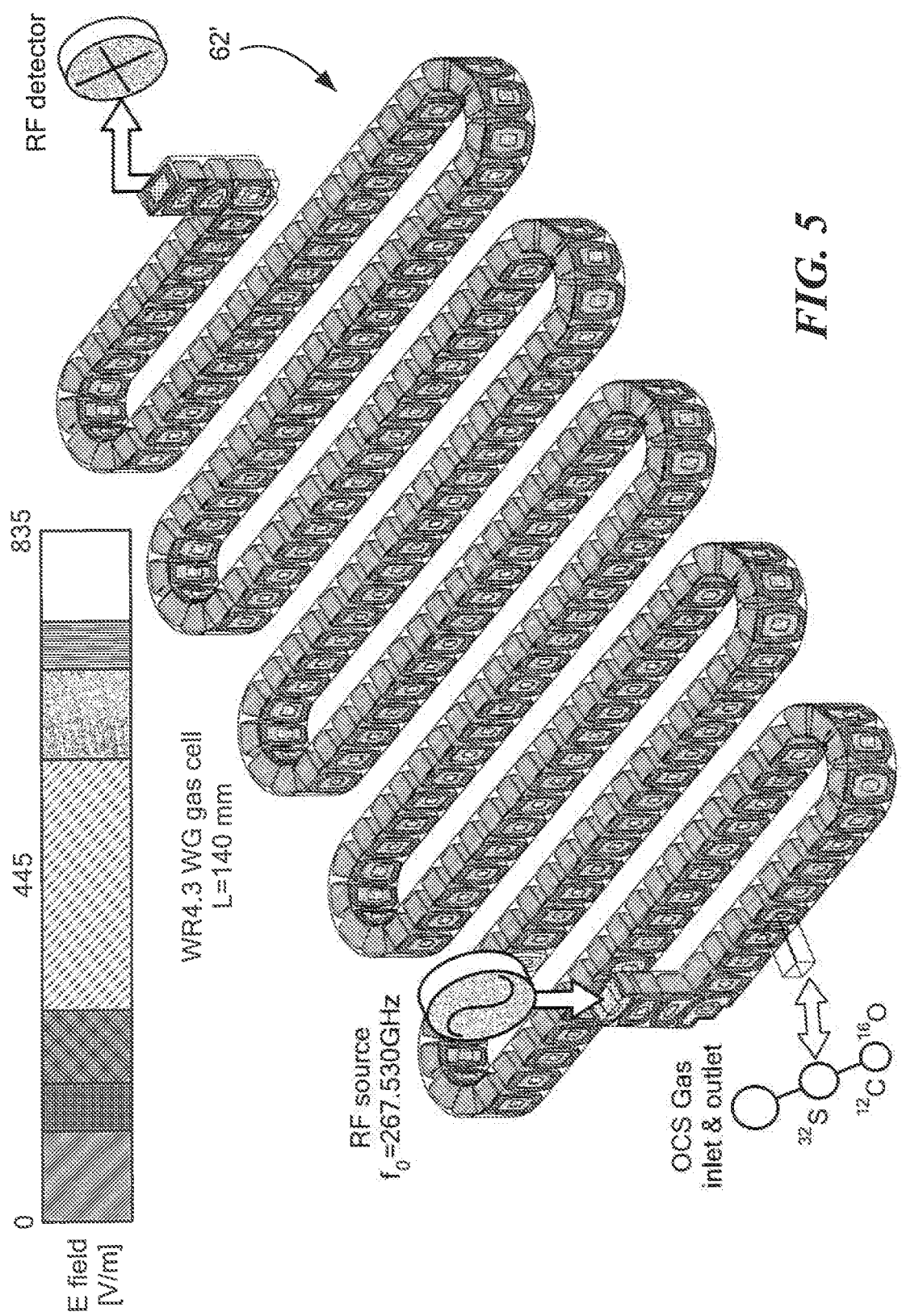
FIG. 5 is a perspective view of a waveguide gas cell.

Referring now to FIG. 5, an illustrative metallic rectangular waveguide gas cell, which may be the same as or similar to the waveguide gas cells described above in FIGS. 2 and 3, has an RF input, an RF output and a gas inlet and outlet. The waveguide gas cell is provided having a rectangular cross-sectional shape. In an embodiment, OCS is introduced into the waveguide gas cell. An RF source is coupled to the RF input and an RF detector is coupled to the RF output. In one illustrative embodiment, the waveguide gas cell is provided having dimensions of 1.092×0.546 $mm^2$ (and thus corresponds to WR-4.3) and a length of 14 cm. The waveguide gas cell is designed to provide maximum signal strength, and fits into only 5.6-$cm^3$ volume with a meander profile.

Figure 5A:
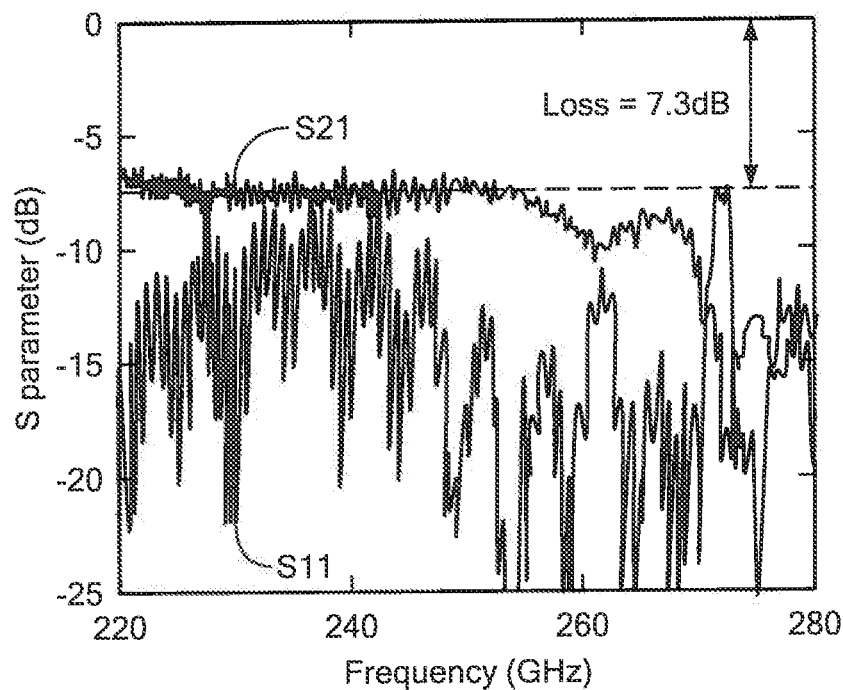
FIG. 5A is a plot of measured S parameters (S11 and S21) of a gas cell vs. frequency.
Figure 5B:
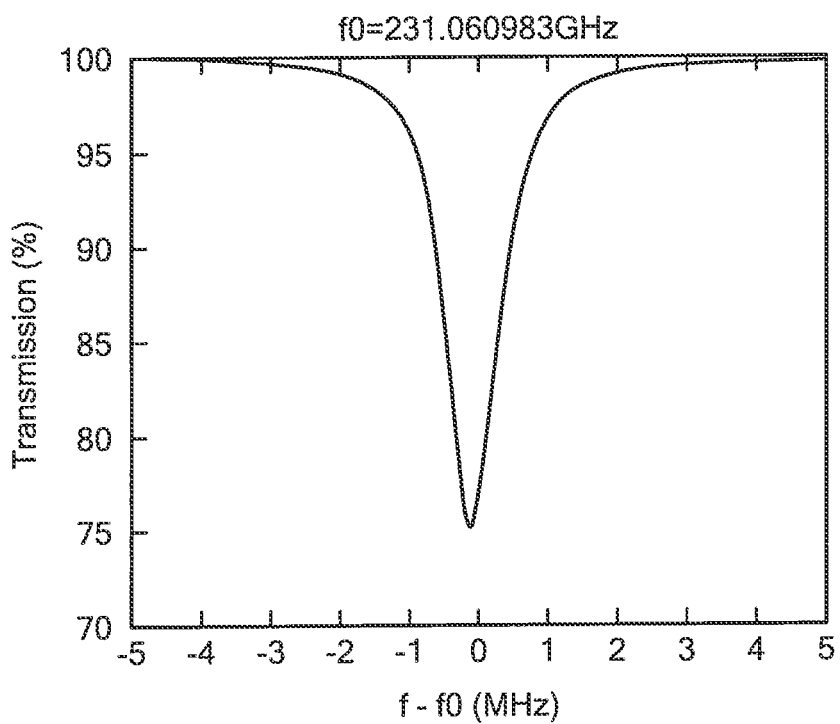
FIG. 5B is a plot of transmission of a gas cell vs. frequency.

Referring now to FIGS. 5A and 5B, shown are measured reflection parameters (S11) and transmission parameters (S21) (FIG. 5A) of the gas cell of FIG. 5 and the spectral line (FIG. 5B) with a quality factor of Q=2.6×$10^5$ (Pressure=5 Pascal, $P_{RF}$=−20 dBm).

Figure 5C:
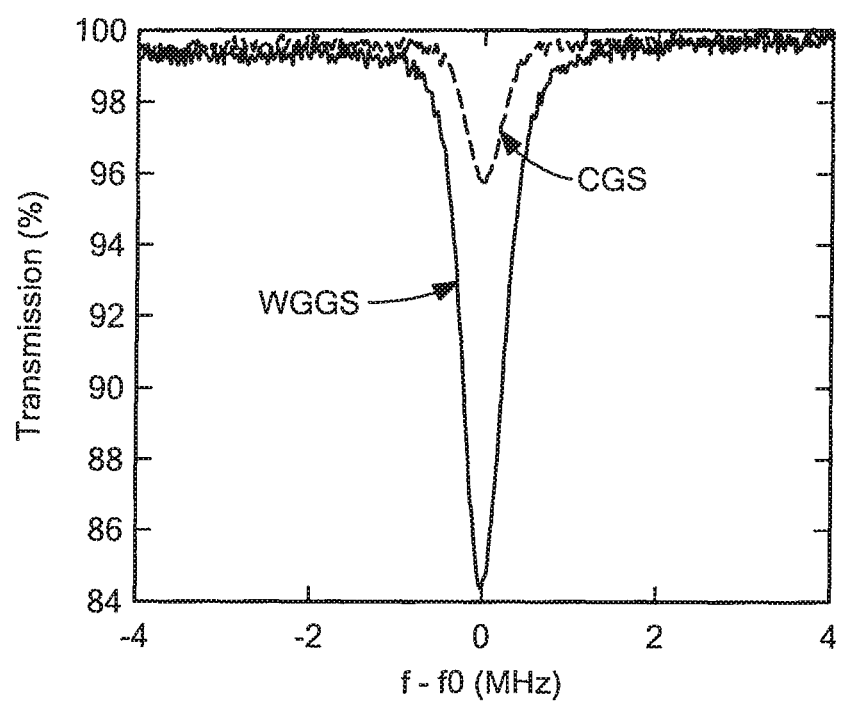
FIG. 5C is a plot of transmission vs. frequency of measured Doppler limited line width of OCS at $f_0=267.530239$ GHz using a Cylinder gas cell (FWHM=534 kHz) and a WR4.3 rectangular waveguide gas cell (FWHM=573 kHz) under pressure of 1 Pascal and RF power of 1 μW.

Referring now to FIG. 5C, curve WGGS illustrates simulated absorption coefficients within 0.1~1 THz of Carbonyl sulfide ($^{16}O^{12}C^{32}S$, blue) and Ammonia ($^{14}N^{1}H_3$, red) under pressure of 10 Pascal while curve CGS corresponds to a measured Doppler-limited linewidth based upon a wide cylindrical gas cell at room temperature.

As can be seen by comparing curves WGGS and CGS, $NH_3$ has a 2× lower $Q$ due to lighter weight of molecule.

When the gas cell dimension is comparable with the mean free path of OCS ($\lambda_0$=1.28 mm), the collision between OCS molecules and the cell wall causes spectral broadening. Thus the transmission percentage of the cylinder gas cell is less that the transmission percentage of waveguide gas cell. Thus, as can also be seen in FIG. 5C, collision results in the cylindrical gas cell having a line width of 573 kHz ($Q$ = 4.7×10$^5$).

Figure 6:
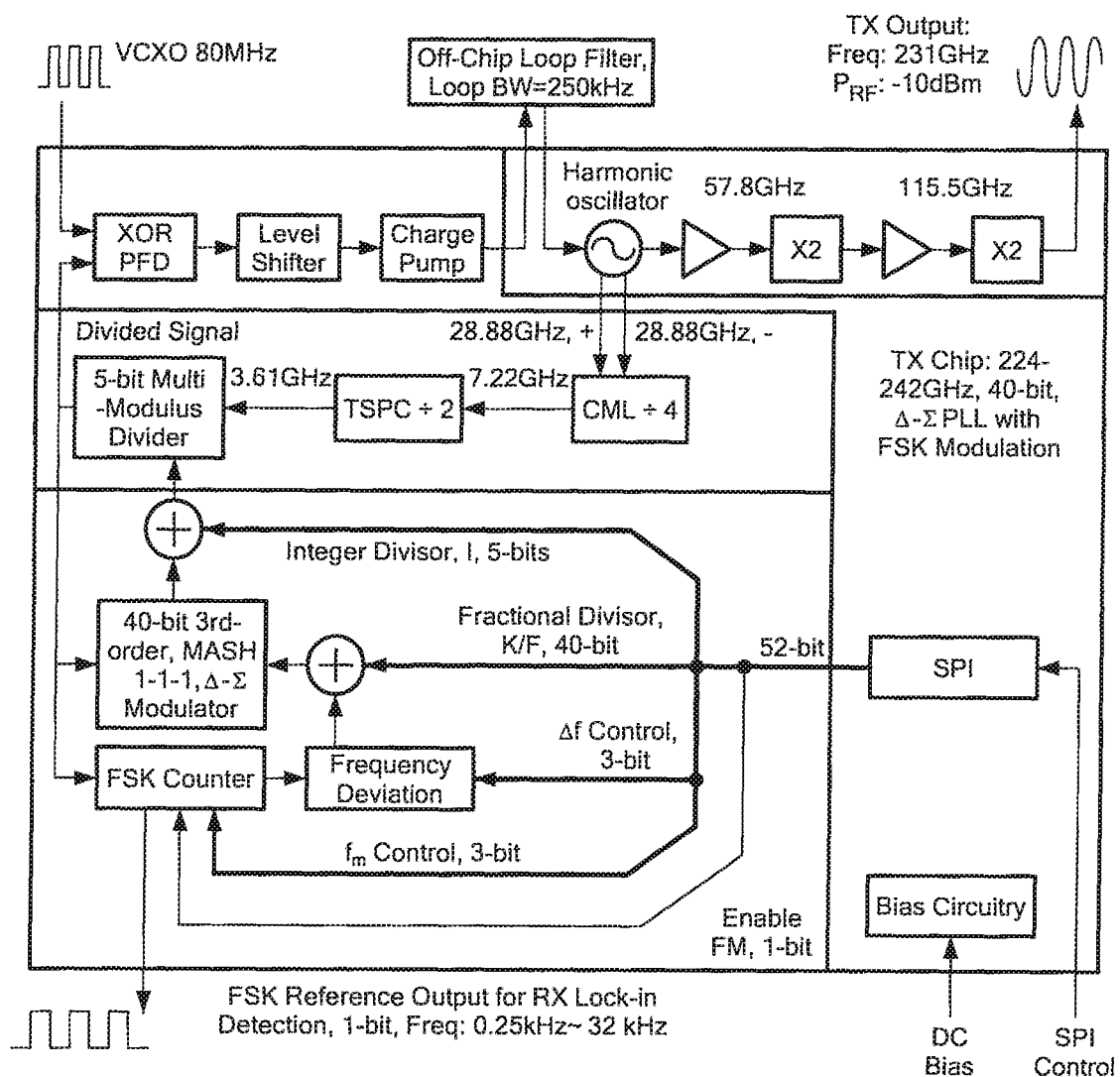
FIG. 6 is a block diagram of a fractional-N phase-locked loop (PLL) for a transmitter, such as the transmitter used in the system of FIG. 1.

Referring now to FIG. 6, a fractional-N phase-locked loop (PLL) for a transmitter, such as any of the transmitters described above in conjunction with FIGS. 2-4 includes a harmonic oscillator cascaded by a multiplier chain to generate a probing signal. The embodiment of FIG. 6 illustrates a 224~242 GHz fractional-N phase-locked loop (PLL) for a transmitter with a 57.8 GHz harmonic oscillator cascaded by a multiplier chain to generate the probing signal. A 40-bit Mash 1-1-1 $\Delta$-$\Sigma$ modulator enables a frequency resolution of 10$^{-12}$. FSK modulation is performed by resetting the control word of fractional-N PLL based on a FSK counter. The $f_m$ and $\Delta f$ of FSK are selectable with a resolution of 3-bit.

In an embodiment, the measured output power of transmitter Tx and the noise equivalent power (NEP) for the receiver Rx are −20.2 dBm and 0.5 nW/$\sqrt{Hz}$, respectively, including the ~10 dB loss of quartz probe. The passive integrator and gain unit are put off-chip for the convenience of loop parameter adjustment.

Figure 7:
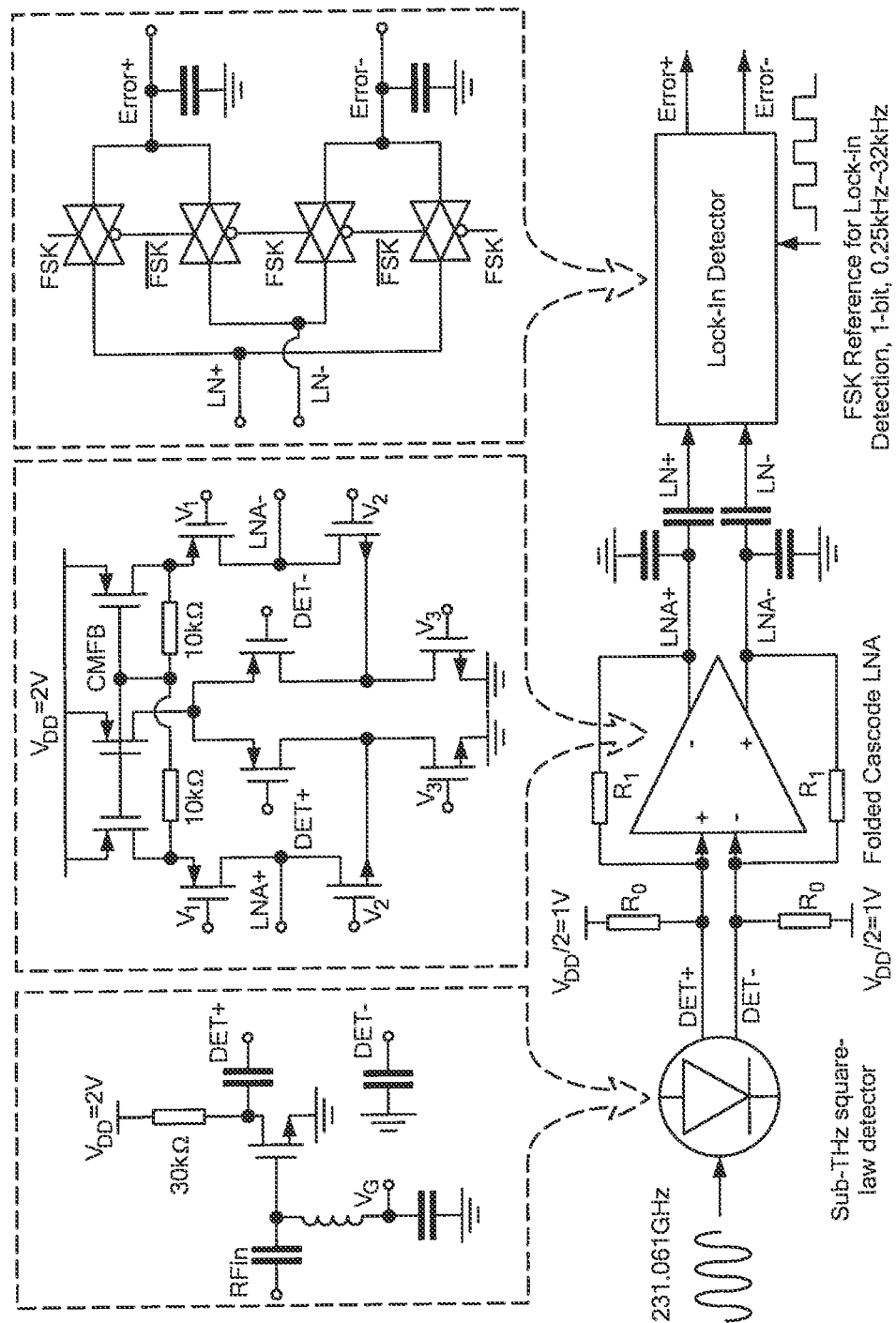
FIG. 7, is a schematic diagram of a receiver, such as the receiver used in the system of FIG. 1.

Referring now to FIG. 7, on the receive Rx side, a sub-THz power detector, a low noise operational amplifier (op-amp) and an on-chip lock-in detector are integrated to demodulate the probing sub-THz signal. The waveguide-to-chip transition based upon a waveguide E-plane quartz probe is designed to bridge the CMOS chip with the WR4.3 waveguide gas cell.

In embodiments, The receiver includes a transistor (e.g. an NMOS transistor) biased under sub-threshold and utilized as a square law power detector. In embodiments, the receiver further includes a low noise folded cascode op-amp which further amplifies the baseband signal. An error signal produced by the cascode op-amp is detected by an on-chip lock-in detector, which is clocked by a signal having a frequency $f_m$.

A chip-to-waveguide transition (such as that described in conjunction with FIGS. 2-4) using a quartz probe may be used to extract an RF signal from the circuit. A voltage controlled crystal oscillator (VCXO) and passive integrator are arranged off-chip to allow for loop parameter adjustment. It should be appreciated, however, that in other embodiments the VCXO and passive integrator may be arranged on-chip.

In this particular embodiment, the output power of a signal from the transmitter Tx is −20.2 dBm at a frequency of 231.061 GHz, which includes the loss of the chip-to-waveguide transition (~10 dB). The saturation effect of the molecules is still under the saturation threshold which means sufficient high power level of probing signal will pull the molecules off the equilibrium. This effect then reduces the absorption ratio of the spectral line.

Figure 8:
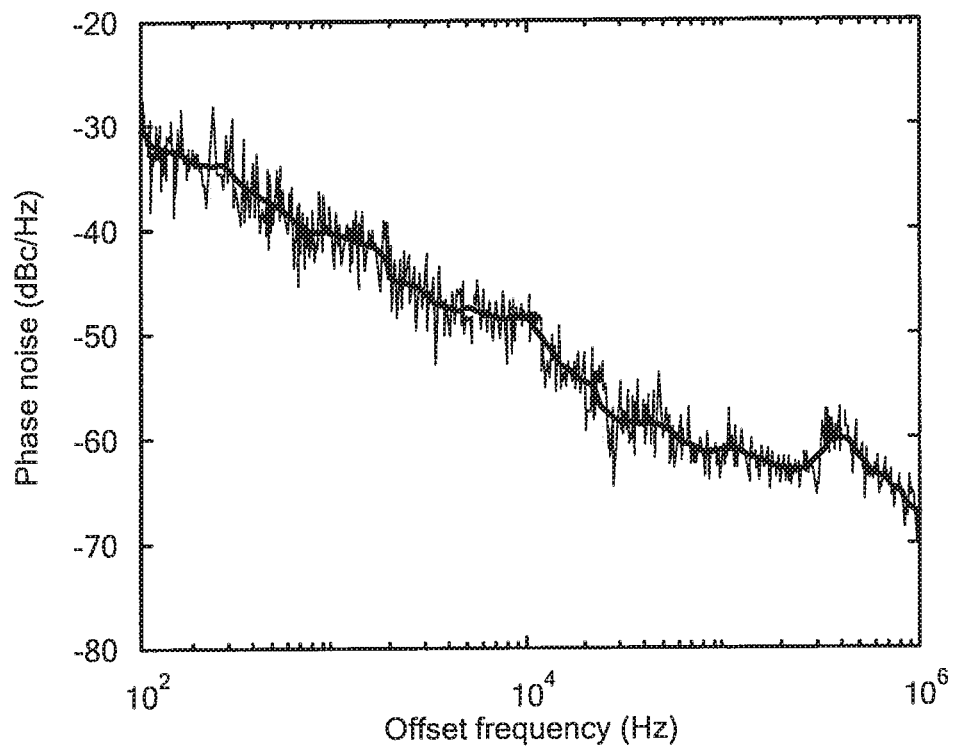
FIG. 8 is plot of measured phase noise vs. frequency.

Referring now to FIG. 8, it can be seen that a receiver Rx which may be the same as or similar to the receiver described in conjunction with FIGS. 1-4 and 7, achieves a measured phase noise of −68.4 dBc/Hz with frequency offset of 1 MHz.

Figure 8A:
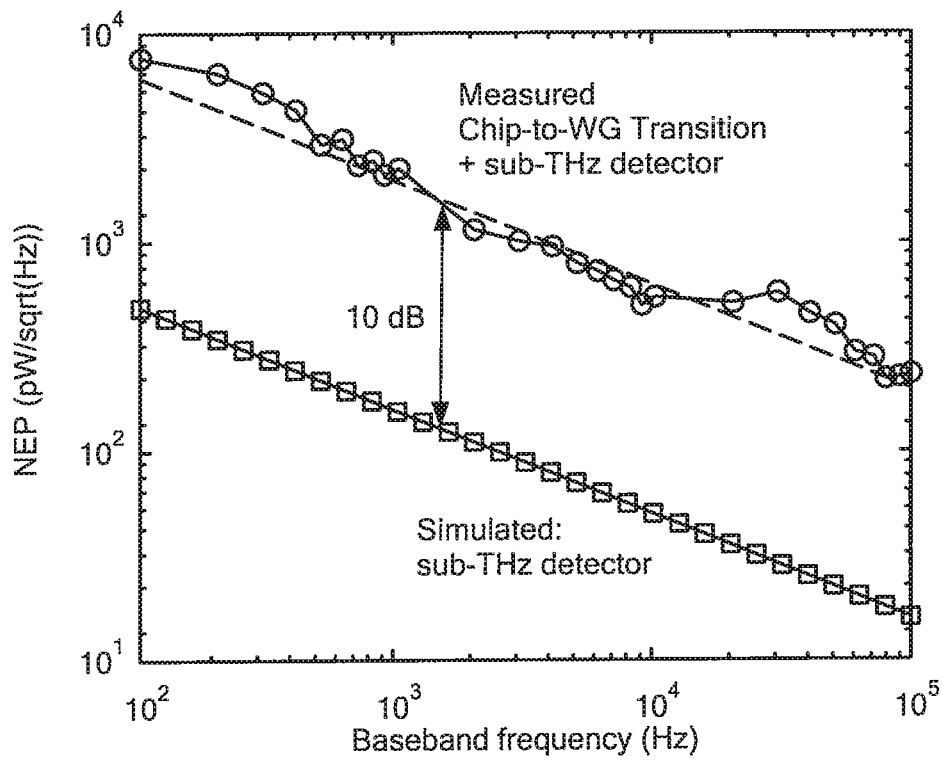
FIG. 8A is plot of receiver noise equivalent power (NEP) vs. frequency.

Referring now to FIG. 8A, it can be seen that a receiver Rx, which may be the same as or similar to the receiver described in conjunction with FIGS. 1-4 and 7, achieves a noise equivalent power (NEP) of 501 pW/Hz$^{0.5}$ at $f_m$=16 KHz (including the transition loss—e.g. through a chip-to-waveguide gas cell transition).

Referring now to FIG. 9, integrated circuits which may be the same as or similar to the integrated circuits described in conjunction with FIGS. 2-4, 6 and 7 may be assembled in a package (i.e. a housing) coupled to a waveguide gas cell (herein comprising a WR4.3 waveguide) and a vacuum pump. In this illustrative embodiment, the waveguide meanders along a straight line length (i.e. as measured along a central longitudinal axis of the housing in which a channels is provided) of about 30 cm. The housing has input to accept DC bias, SPI and error signals as well as a 8-MHz signal from a VCXO. With this illustrative embodiment, a SNR of 445 or 53 dB with unit bandwidth is obtained under an OCS pressure of 5 Pascal.

Referring now to FIG. 9A is an illustrative waveguide gas cell 62' which may be functionally the same as or similar to any of the gas cells described hereinabove in conjunction with FIGS. 1, 2, 3, 4, 5, and 9 and suitable for use with the molecular clock described in conjunction with FIG. 9. In this illustrative embodiment, the gas cell 62' has first (or upper) and second (or lower) plates having channels provided therein. When the first and second plates are properly aligned and joined, the channels for a waveguide having inputs and outputs as described above.

Figure 9B:
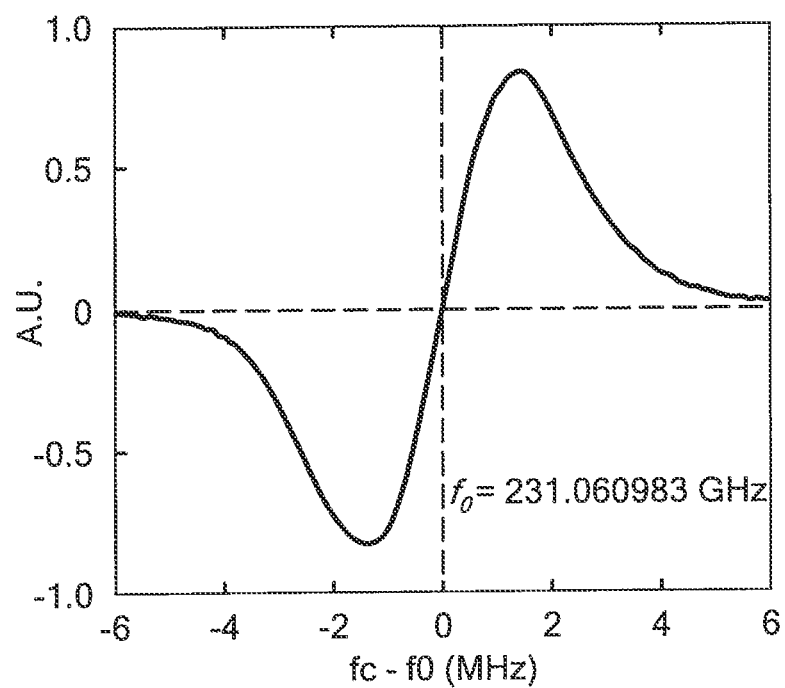
FIG. 9B is a plot of a measured dispersion curve having a signal-to-noise ratio (SNR) of 445 or 53 dB using a molecular clock module of FIG. 9.

Referring now to FIG. 9B, shown is a fundamental dispersion curve (FSK, $f_m$=16 kHz, $\Delta f$=1 MHz) of 231.061 GHz spectral line of OCS measured by a CMOS molecular clock such as the packaged CMOS molecular clock module shown in FIG. 9. The molecular clock is locked onto the zero-crossing point of the dispersion curve. The measured dispersion curve has an SNR of 445 or 53 dB.

Figure 10:
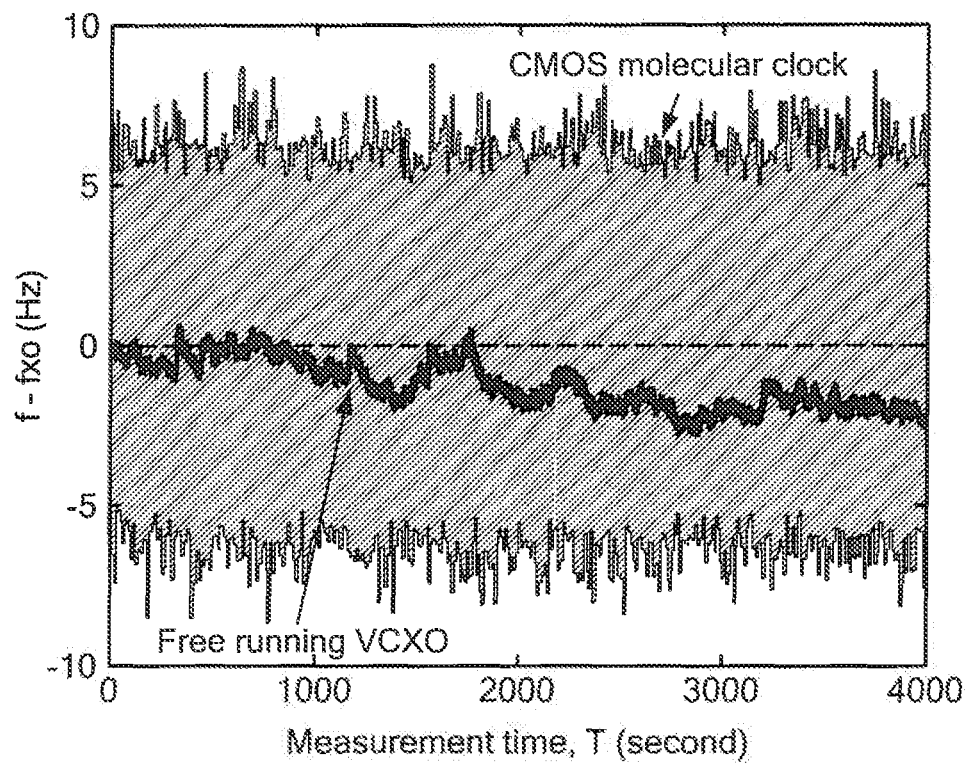
FIG. 10 is a plot of measured instantaneous frequency of a closed-loop clock and free running VCXO vs. time for a molecular clock module.
Figure 10A:
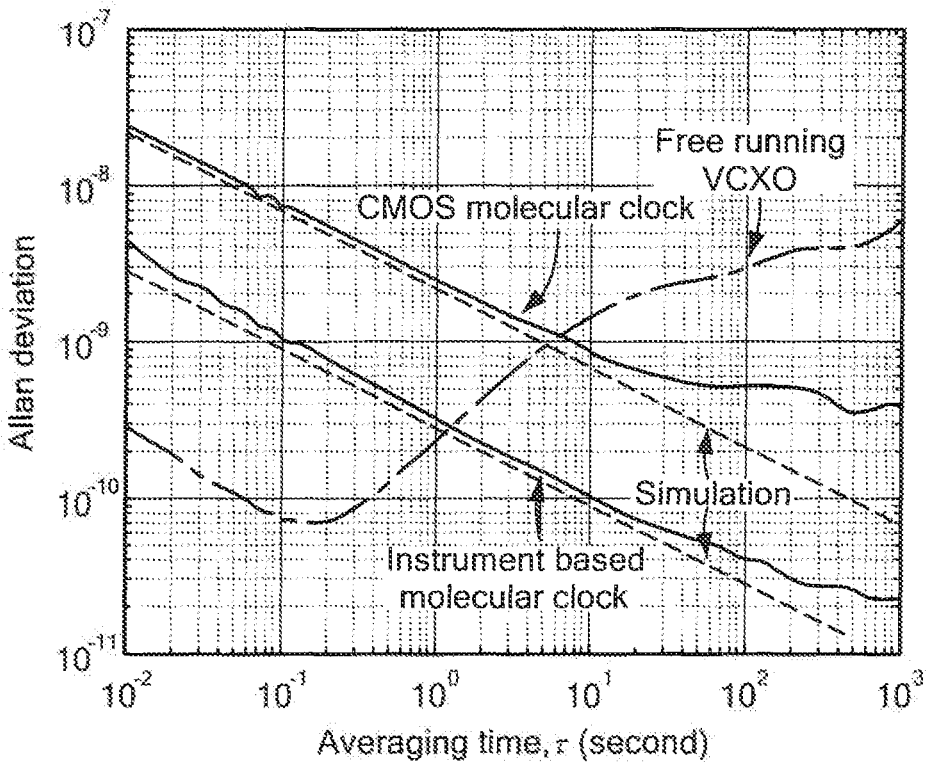
FIG. 10A is a plot of measured Allen Deviation vs. averaging time for a molecular clock module.

Referring now to FIG. 10 a measured instantaneous frequency of closed-loop clock and a free running VCXO is shown to be within 4000 s. Although the VCXO is disturbed in short-term due to the limited SNR, the long-term stability is improved by the spectral line locking (i.e. while disturbing the short term stability, the long term stability is enhanced).

Referring now to FIG. 10A, a measured stability (defined as) of a CMOS molecular clock (which may be the same as or similar to the types described herein above in conjunction with FIGS. 3 and 4) and provided in accordance with the concepts described herein achieves an Allan deviation $\sigma_y$=2.4×10$^{-10}$ for $\tau$=1 s and $\sigma_y$=3.8×10$^{-10}$ for $\tau$=10$^3$ s, respectively. In embodiments, the CMOS molecular clock consumes a total DC power of 66 mW, excluding the VCXO. The total physical volume of CMOS molecular clock is 50 cm$^3$.

Table I shows measured parameters of a CMOS molecular clock, an instrument based molecular clock (denoted below as "Instrument MC") and prior art clocks (i.e. a pair of CSACs, and an NH$_3$ Clock) taken respectively from: [1] D. Ruffieux, et al., *ISSCC*, pp. 48-49, February 2011; [2] Microsemi. Quantum™, SA.54s chip scale atomic clock, 2017; and [3] D. J. Wineland, *IEEE Trans. Instr. Meas.*, pp. 122-132, June 1979 as shown.

TABLE I

PERFORMANCE COMPARISON

|  | ADEV (1 s) | ADEV ($10^3$ s) | BW (kHz) | Size ($cm^3$) | $P_{DC}$ (Mw) |
|---|---|---|---|---|---|
| CMOS | $2.4 \times 10^{-9}$ | $3.8 \times 10^{-10}$ | <100 | 50 | 66 + 50 |
| Instrument MC | $3.2 \times 10^{-10}$ | $2.2 \times 10^{-11}$ | <100 | N/A | N/A |
| CSAC [1] | $4 \times 10^{-10}$ | $3 \times 10^{-10}$ | N/A | N/A | 26 |
| CSAC [2] | $3 \times 10^{-10}$ | $1 \times 10^{-11}$ | <0.1 | 16 | 120 |
| $NH_3$ Clock [3] | $6 \times 10^{-10}$ | $2 \times 10^{-10}$ | <10 | $10^3$ | $3 \times 10^3$ |

Although the CMOS clock is still inferior, at least in some respects, to an instrument based clock as shown in Table I, which is mainly limited by SNR, further performance enhancement is highly achievable by loss reduction and a heterodyne detection. Due to the 880 KHz linewidth, the clock has a loop bandwidth ~1000 time that of a CSAC. Excluding the VCXO, it consumes a DC power of 66 mW and has a volume of 50 $cm^3$. Power consumption of 40 mW and volume of 10 $cm^3$ are predicted by adopting crystal free molecular clock design and permanent vacuum sealing.

The short-term stability of a clock is determined by the product of signal-to-noise ratio (SNR) and quality factor ($\mathcal{Q}$) of the detected spectral line. Thus, the significantly enhanced absorption intensity of rotational spectrum of OCS improves the SNR of the clock.

As noted above, when rotating, the linear OCS molecule can be approximated as a rigid rotor with quantized rotational energy levels (indicated by quantum number J). For the transition from energy state J to J+1, the frequency of incident photon should be $f_{J+1 \leftarrow J} = 2B_{OCS}(J+1)$, where $B_{OCS}$ GHz) is the rotational constant of OCS. Therefore, the rotation spectrum of OCS comprises of a set of absorption spectral lines with an equal frequency spacing of $2B_{OCS}$, as shown in FIG. 11.

Figure 11:
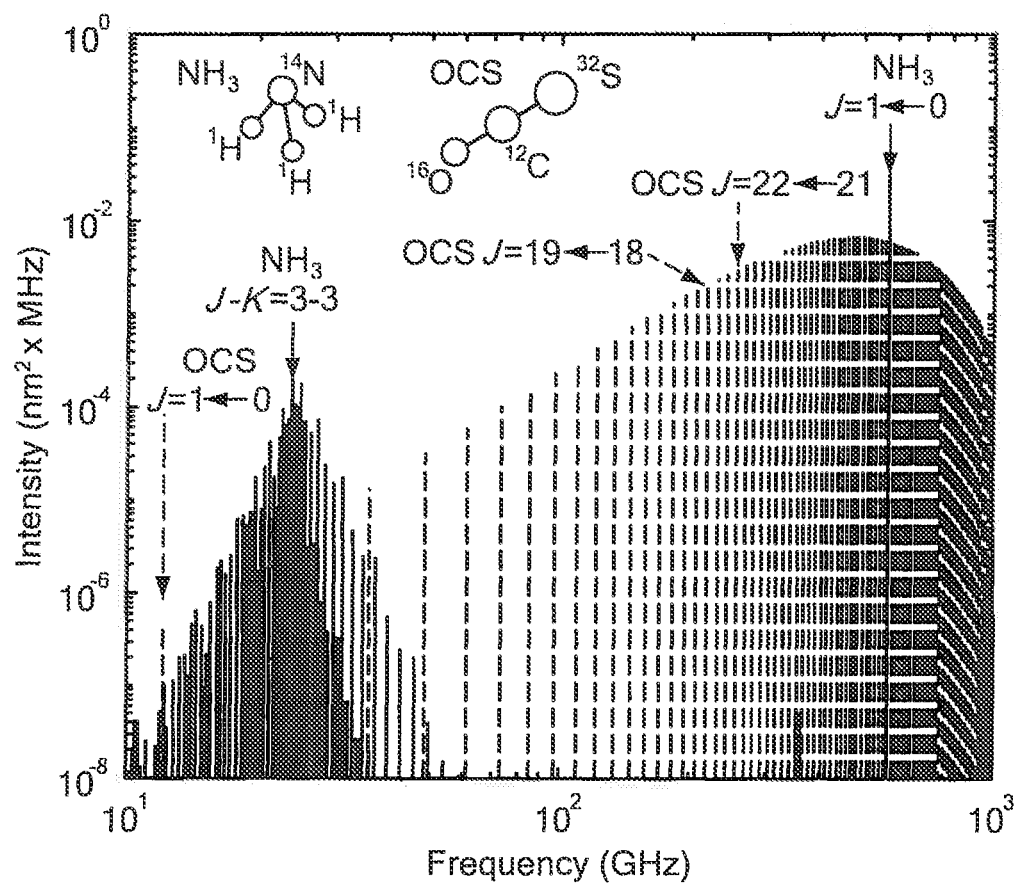
FIG. 11 is a plot of intensity vs. frequency which illustrates a simulated absorption coefficient within 0.1~1 THz of Carbonyl sulfide ($^{16}O^{12}C^{32}S$, blue) and Ammonia ($^{14}N^1H_3$, red) under pressure of 10 Pascal.

Referring now to FIG. 11, each J-state has 2J+1 degenerated states, explaining the higher absorption in sub-THz than in microwave range. On the other hand, population of molecules decreases exponentially with the molecule energy due to Boltzmann's distribution. Beyond ~500 GHz where maximum absorption occurs, this effect becomes dominant and causes absorption decrease.

As also shown in FIG. 11, the peak absorption of the 267.530-GHz spectral line (J=22←21) of OCS is 4440× stronger than that at 12.16 GHz (J=1 0). It is also 98× higher than the inverse spectrum of ammonia ($NH_3$) at 23.87 GHz (J−K=3−3).

Figure 12:
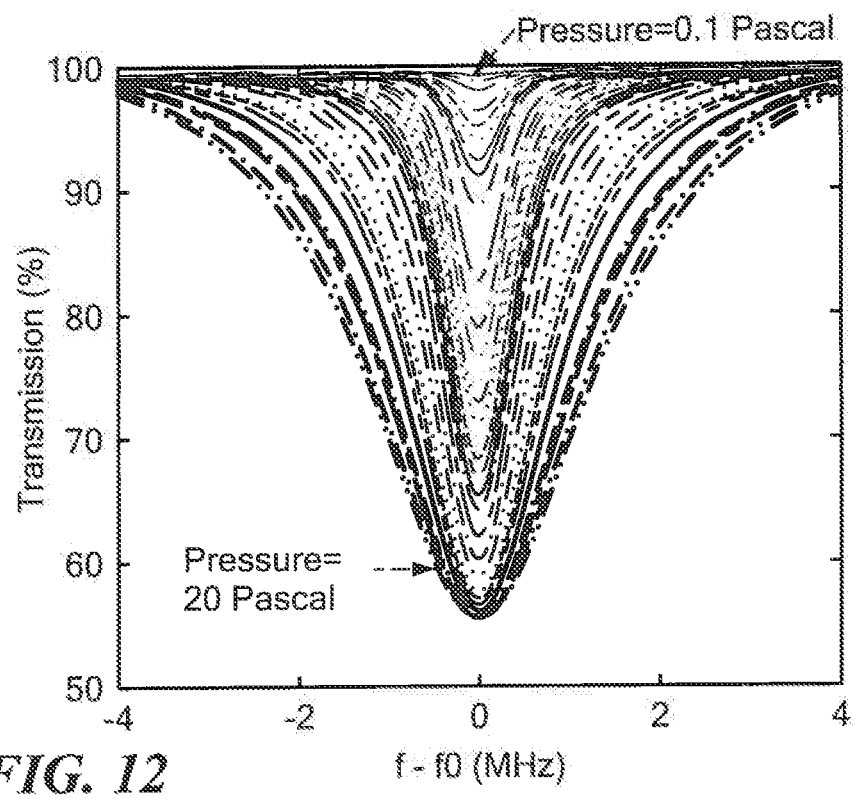
FIG. 12 is plot of transmission vs. frequency at injected RF power of 0.1 μW with a measured line profile at $f_0$ versus pressure in a WR4.3 waveguide gas cell.

Referring now to FIG. 12, a plurality of measure curves show that under increasingly higher pressure, the more significant inter-molecular collisions become the limiting factor for the spectral line profile.

Figure 13:
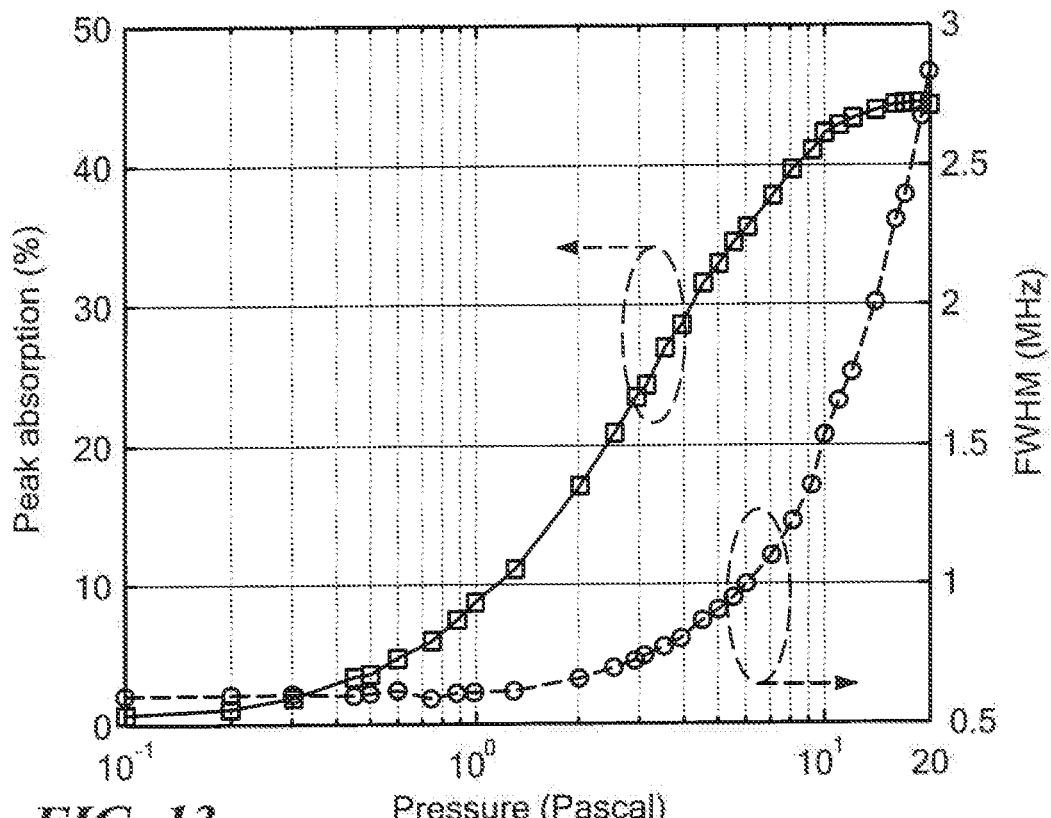
FIG. 13 is plot of peak absorption vs. frequency at injected RF power of 0.1 µW.

Referring now to FIG. 13, a result summary shows that pressure-induced broadening becomes dominant for pressure above ~1 Pascal in a WR-4.3 waveguide gas cell, such as that described above in conjunction with FIG. 10. Lastly, when the incident power for J+1←J transition goes beyond a certain threshold value, the population of molecules on J-state will be gradually depleted, causing saturation.

Figure 14:
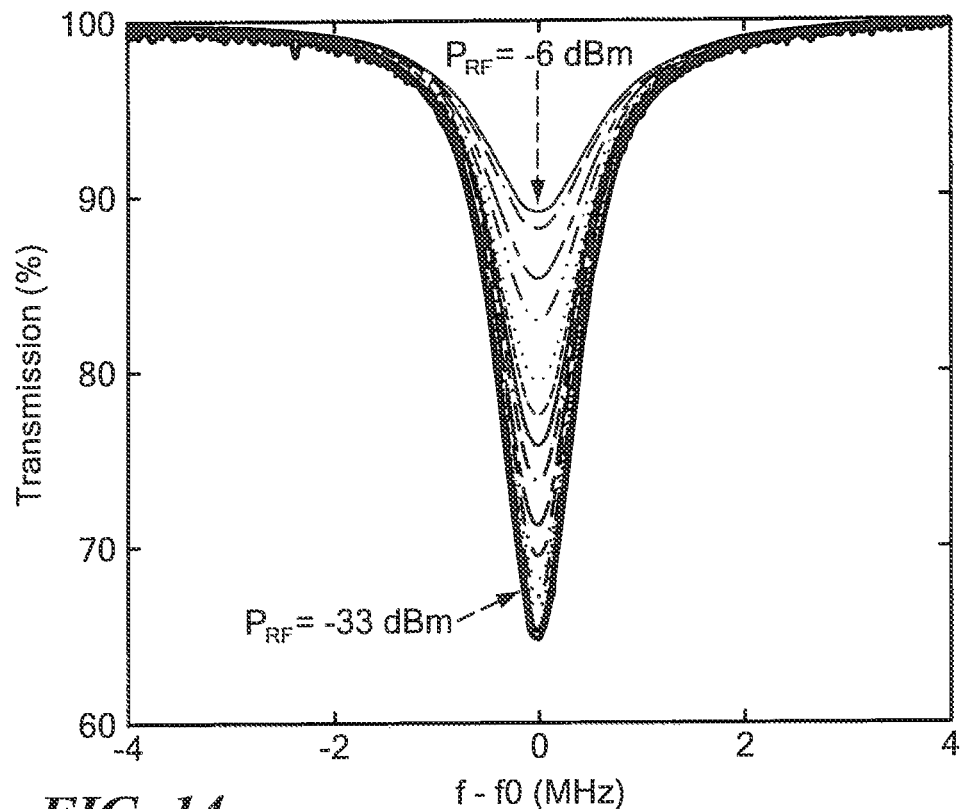
FIG. 14 is plot of transmission vs. frequency at an injected RF power of 1 µW.
Figure 15:
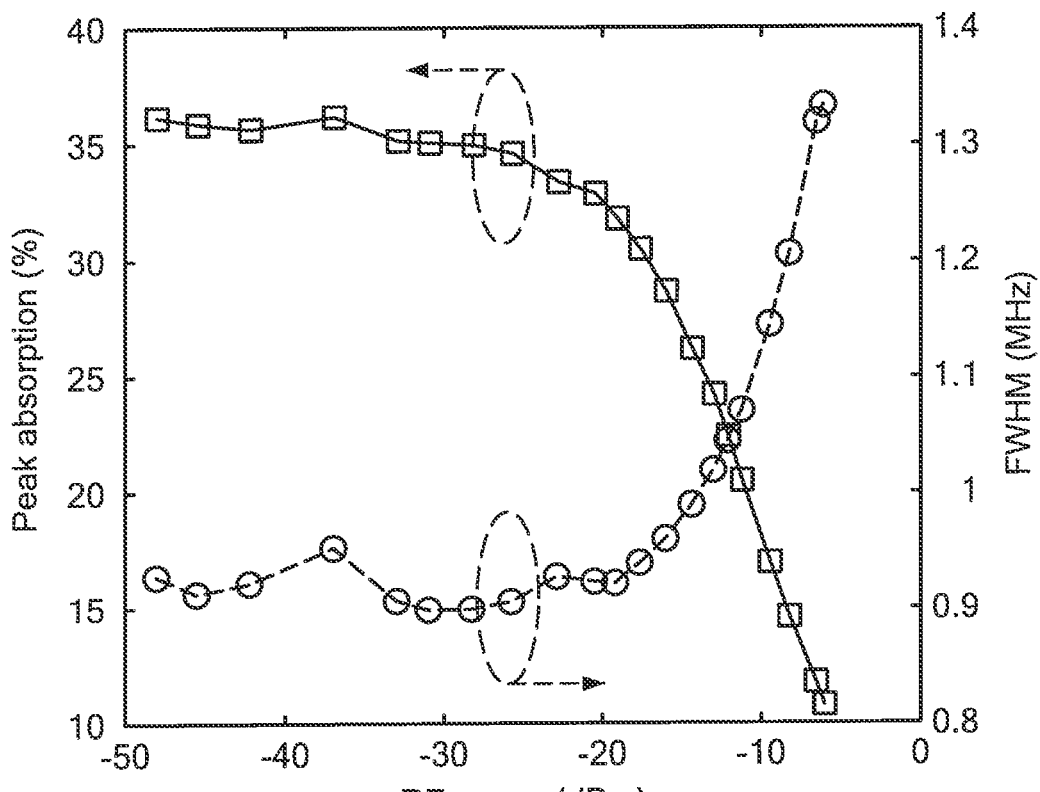
FIG. 15 is plot of peak absorption vs. frequency at injected RF power of 1 µW with a measured line profile at f0 versus injected RF power in a WR4.3 waveguide gas cell with an OCS pressure of 5 Pascal.

As shown in FIGS. 14 and 15, beyond RF power of ~10 μW, the peak absorption decreases along with the line broadening due to the saturation.

Figure 16:
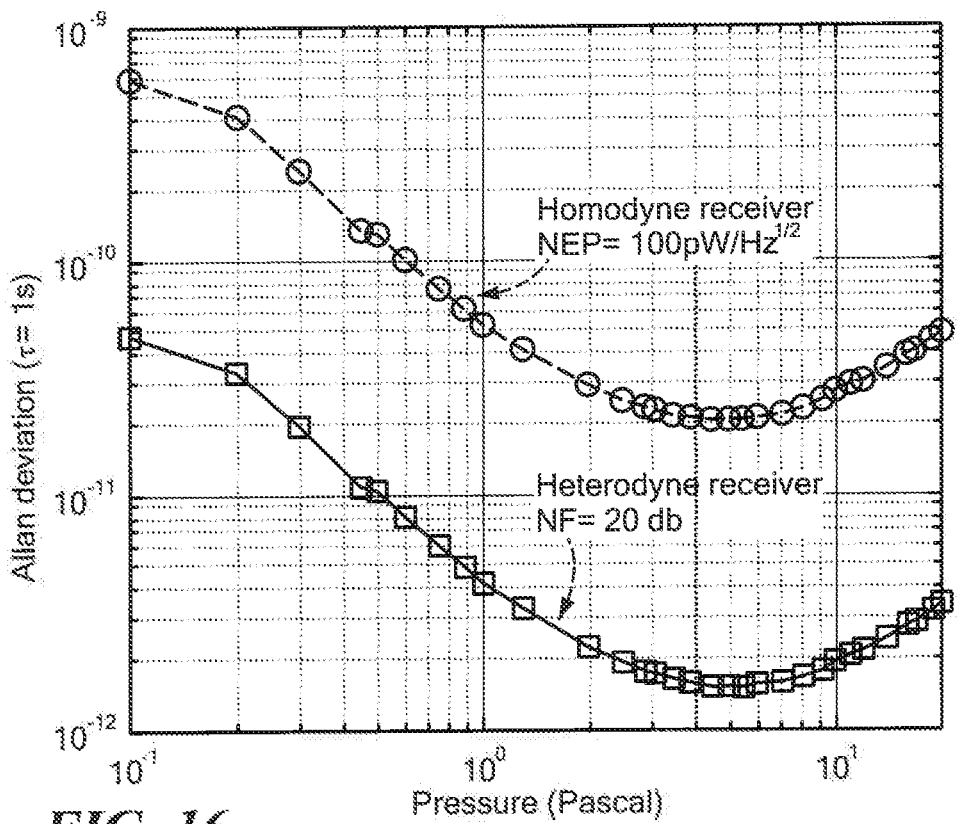
FIG. 16 is plot of simulated Allen deviation vs. pressure with τ=1 s and an assumed RF power of 10 µW.
Figure 17:
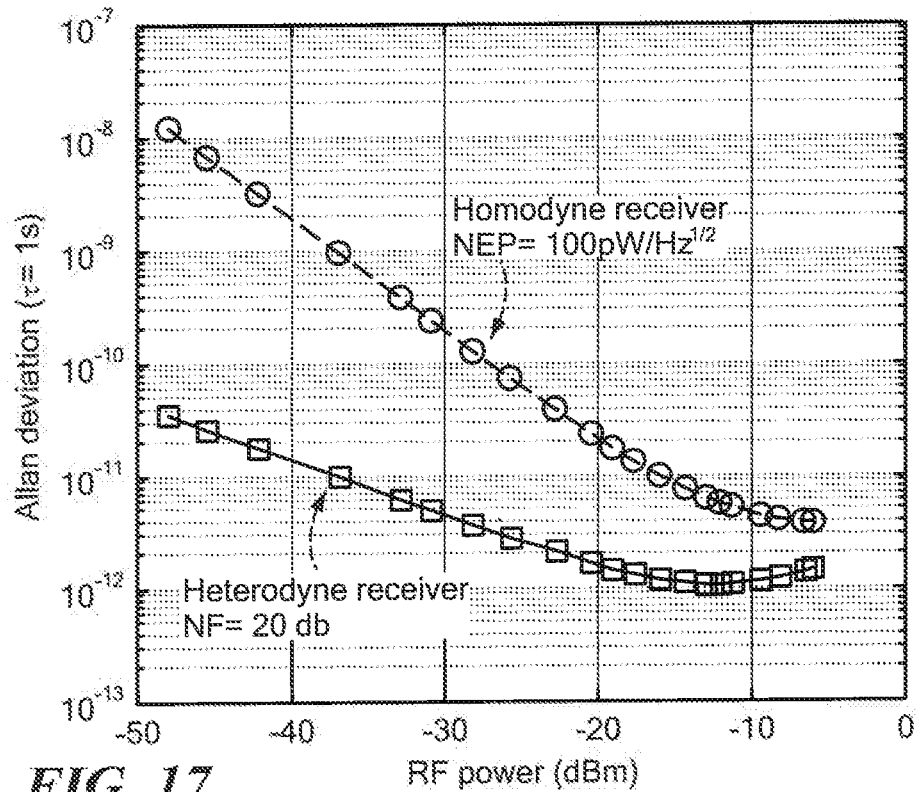
FIG. 17 is plot of Allen deviation vs. frequency with an assumed OCS pressure of 5 Pascal, an assumed noise temperature ($T_{noise,Rx}$) of a heterodyne receiver of $2.97 \times 10^4$ K or a noise figure (NF) of 20 dB and an assumed noise equivalent power (NEP) of a homodyne receiver of 100 pW/√Hz.

With the above measured data, the predicted short-term Allan deviation (τ=1 s) of an OCS clock is presented in FIGS. 16 and 17. Here, state-of-the-art sensitivity performance of CMOS homodyne detectors (using Schottky-barrier diode or field-effect transistor) and CMOS heterodyne receivers (using a frequency mixer driven by a local oscillator) is assumed. For optimum short-term stability, the molecular clock should operate slightly above the Doppler-limited pressure and saturation power thresholds. A short-term stability of $10^{-12}$ (τ=1 s) is achievable under such ideal conditions.

Figure 18:
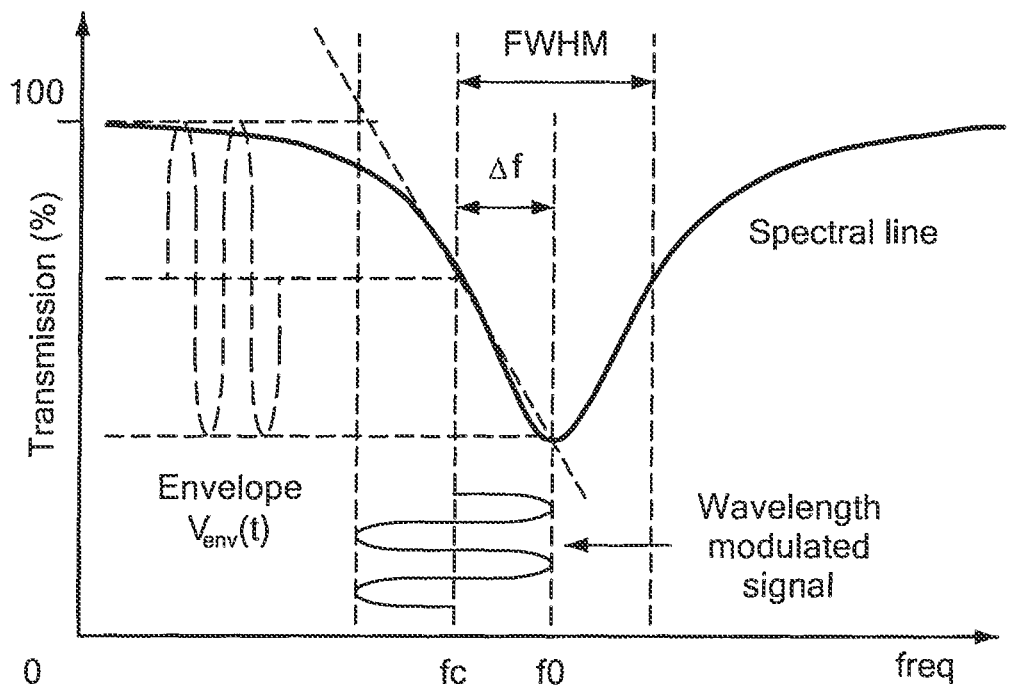
FIG. 18 is a plot of transmission vs. frequency using wavelength modulation spectroscopy (WMS) and an instrument based molecular clock and illustrates probing the rotational spectral line of OCS ($f_c$=267.530 GHz) using WMS.
Figure 18A:
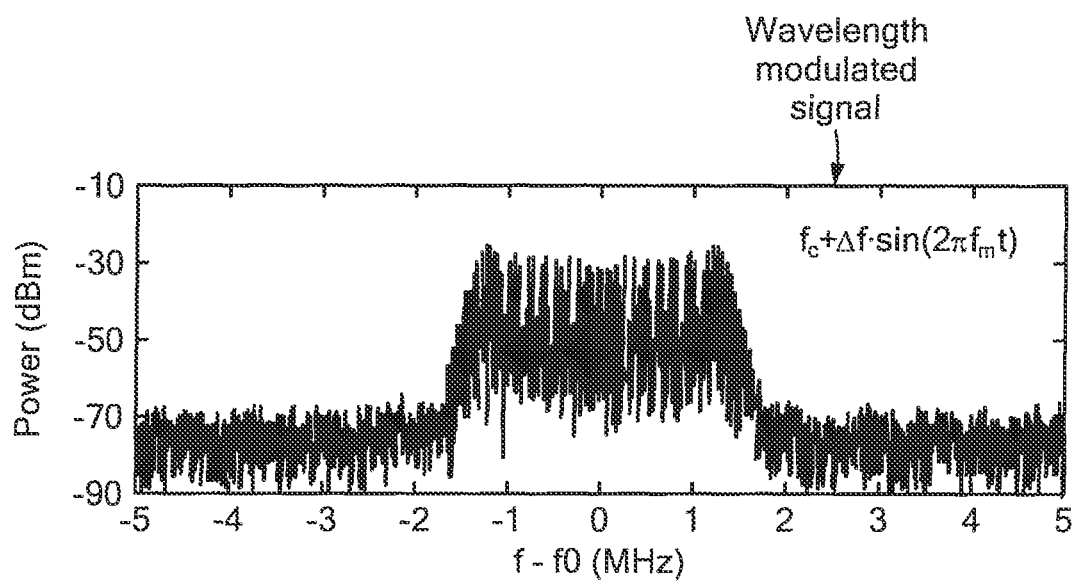
FIG. 18A is a plot of power vs. frequency (power spectrum) of a sub-THz signal with RF power of −13 dBm, modulation frequency of $f_m$=100 kHz and frequency deviation of Δf=1 MHz.

Referring now to FIG. 18, a wavelength modulation spectroscopy (WMS) is adopted to probe the spectral line. As can be seen from FIG. 18A, a center frequency $f_c$ of a sub-THz signal varies with a modulation frequency of $f_m$ and a frequency deviation of Δf, where $f_m \ll \Delta f \approx$ FWHM. When $f_c \approx f_0$, the envelope signal $V_{env}(t)$ of the sub-THz signal fluctuates periodically according to the absorption intensity of OCS. A lock-in detection of the envelope signal $V_{env}(t)$ is then conducted at fundamental and harmonic frequencies of $f_m$.

Figure 19:
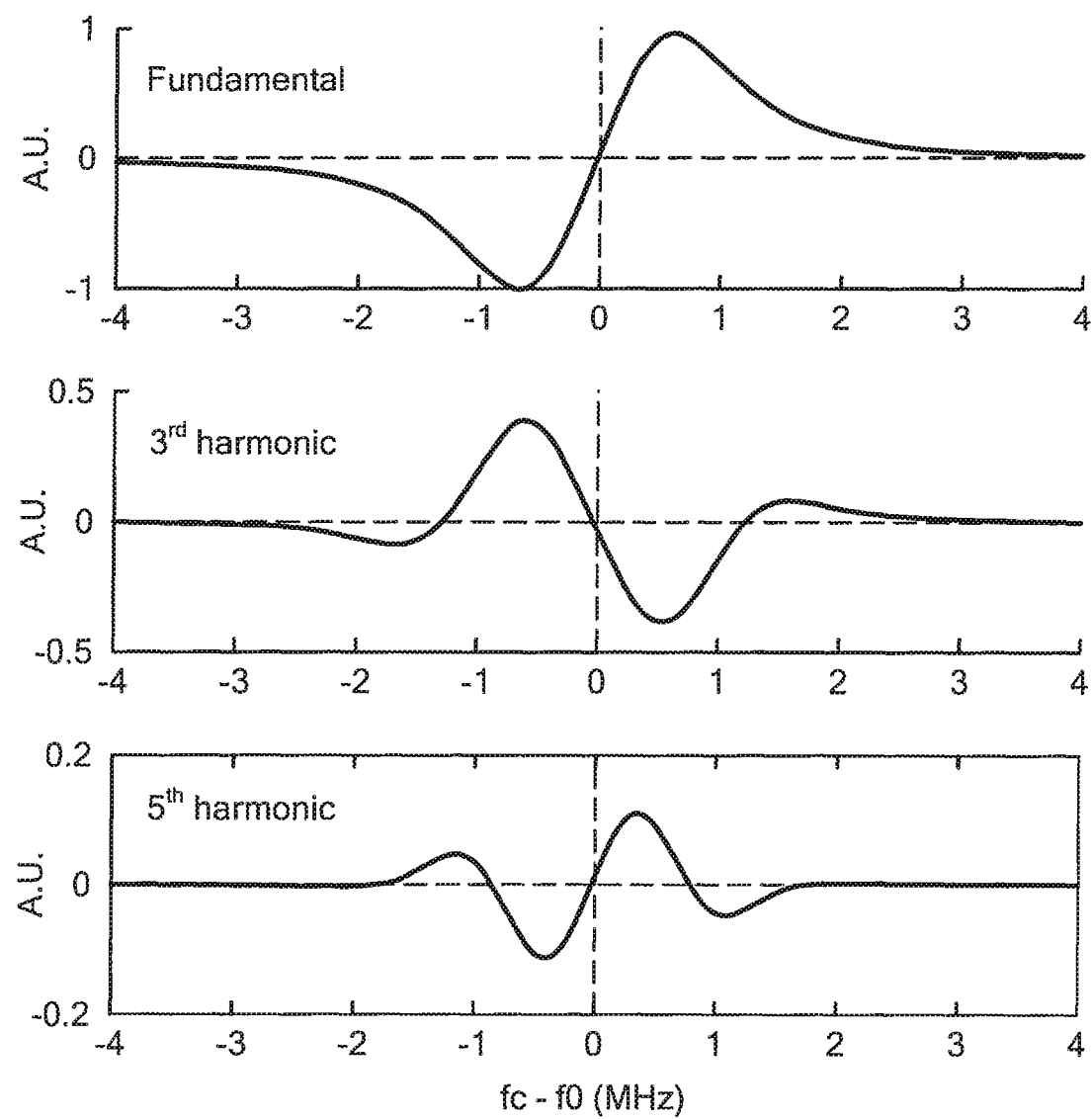
FIG. 19 is a series of plots of measured fundamental, $3^{rd}$ harmonic, and $5^{th}$ harmonic dispersion curves of 267.530 GHz spectral line of OCS with an OCS pressure of 10 Pascal.

Referring now to FIG. 19, by scanning $f_c$ (FIG. 18), spectral curves derived from the $f_m$ 3 $f_m$ and 5 $f_m$ components of the output signal are obtained, which can also be interpreted as the $N^{th}$ order derivatives of the OCS line with a Lorentzian profile.

Figure 20:
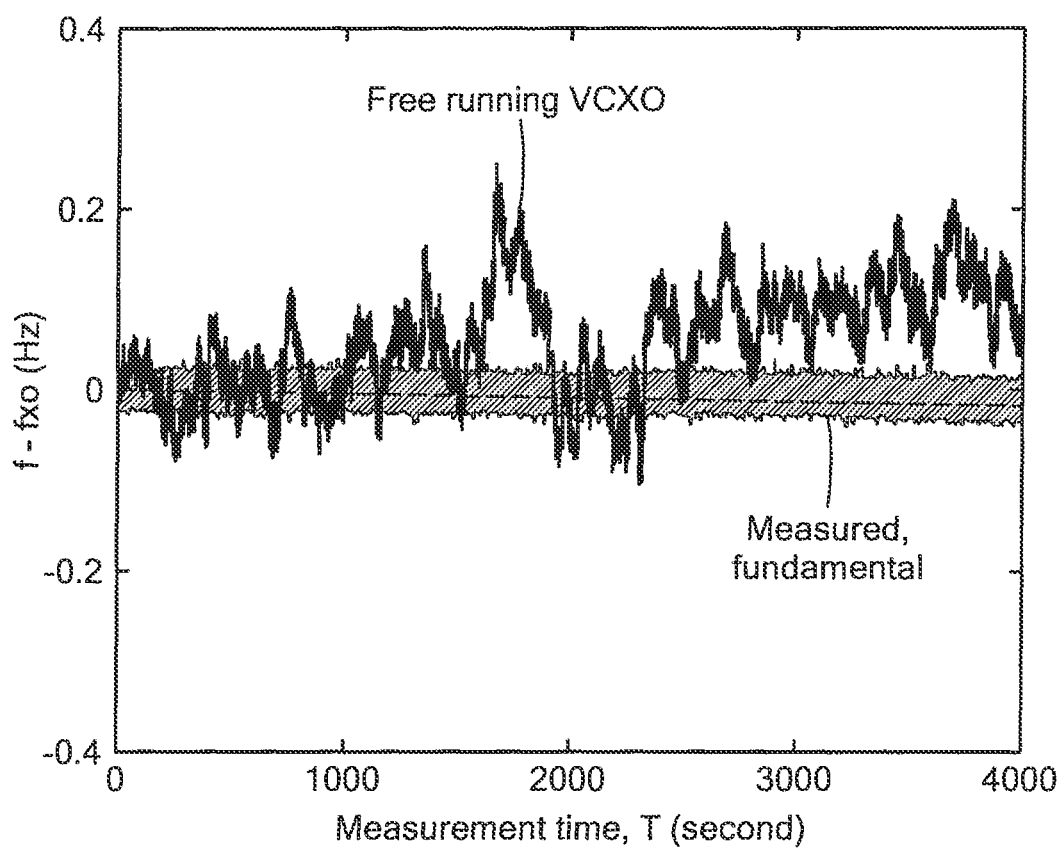
FIGS. 20-20B are a series of plots illustrating measured instantaneous frequency and overlapping Allan deviation. The measured instantaneous frequency of the instrument based molecular clock locking onto fundamental, $3^{rd}$ harmonic and $5^{th}$ harmonic dispersion curves of 267.530 GHz spectral line of OCS are shown in 22, 22(a) and 22(b), respectively. The RF power is −13 dBm. The OCS pressure is 10 Pascal.
Figure 20A:
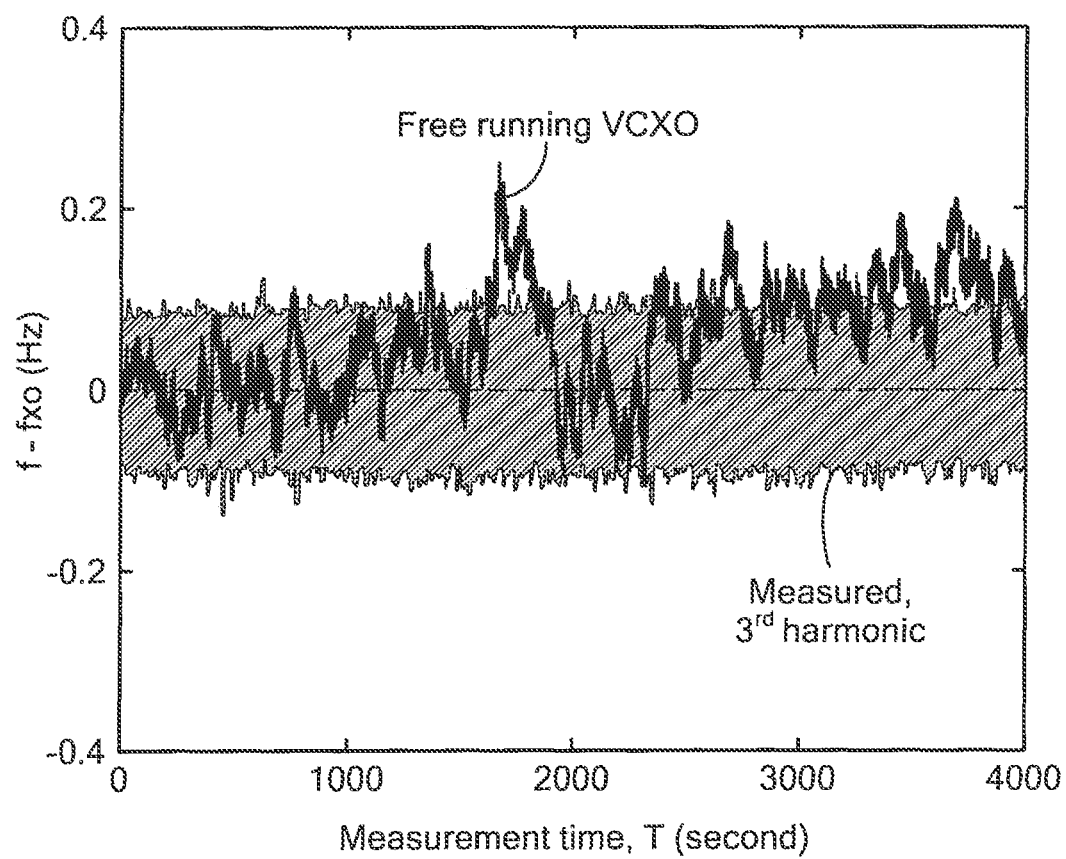
FIGS. 20C-20E show the respective measured overlapping Allan deviations.
Figure 20B:
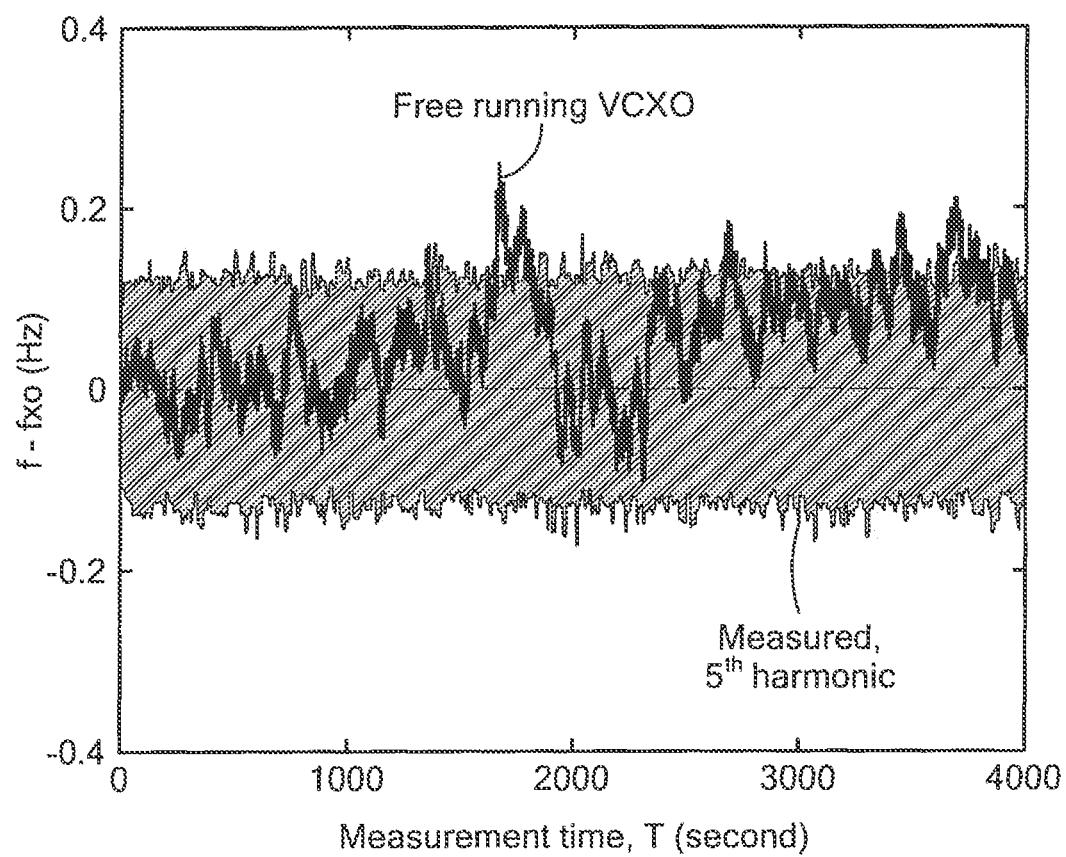
Figure 20C:
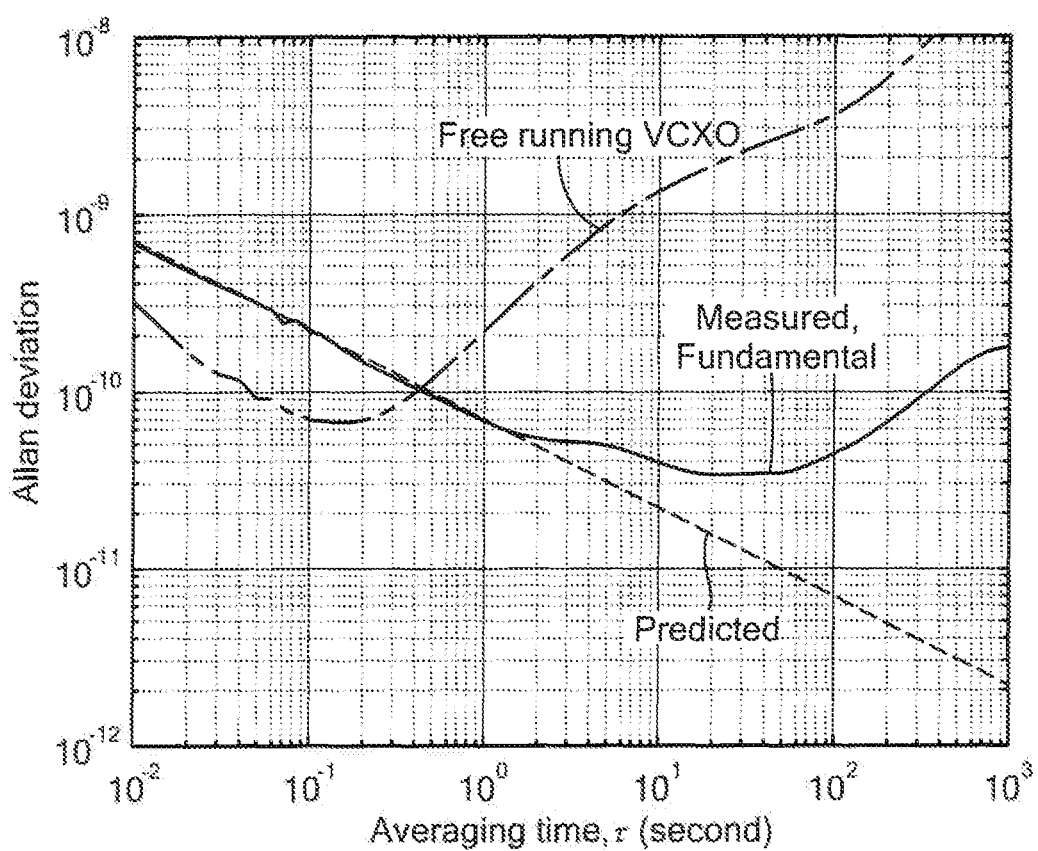
Figure 20D:
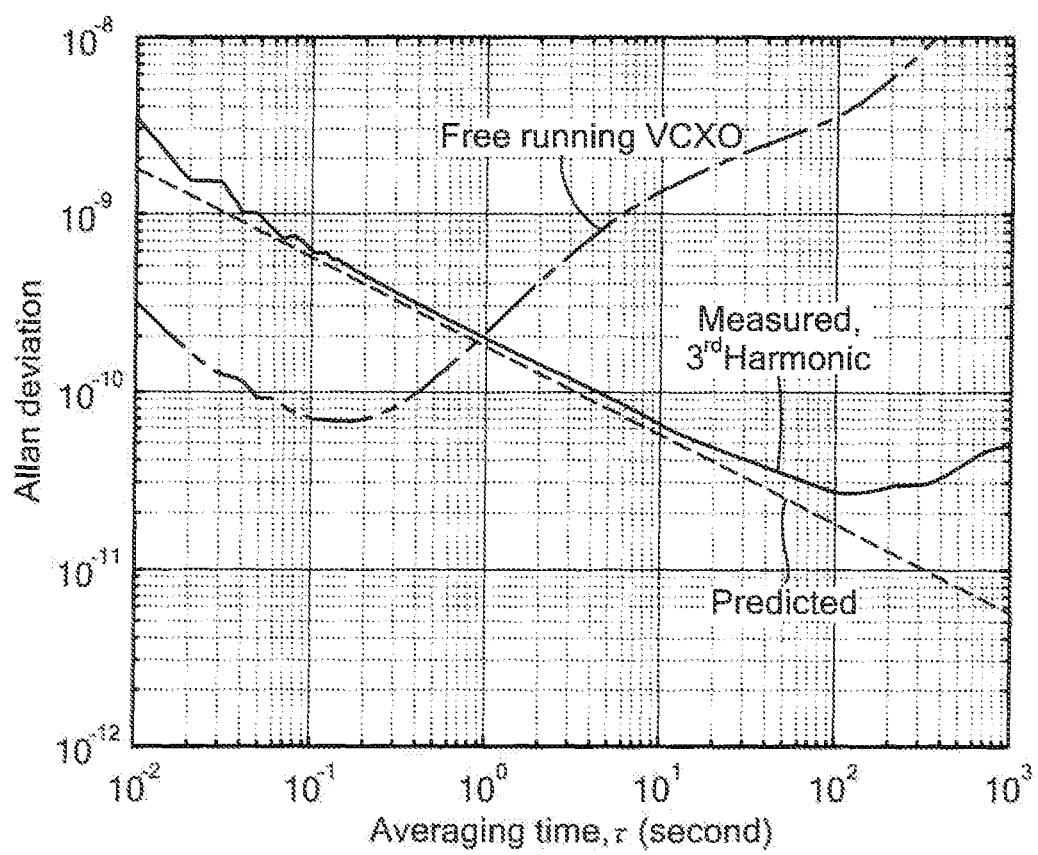
Figure 20E:
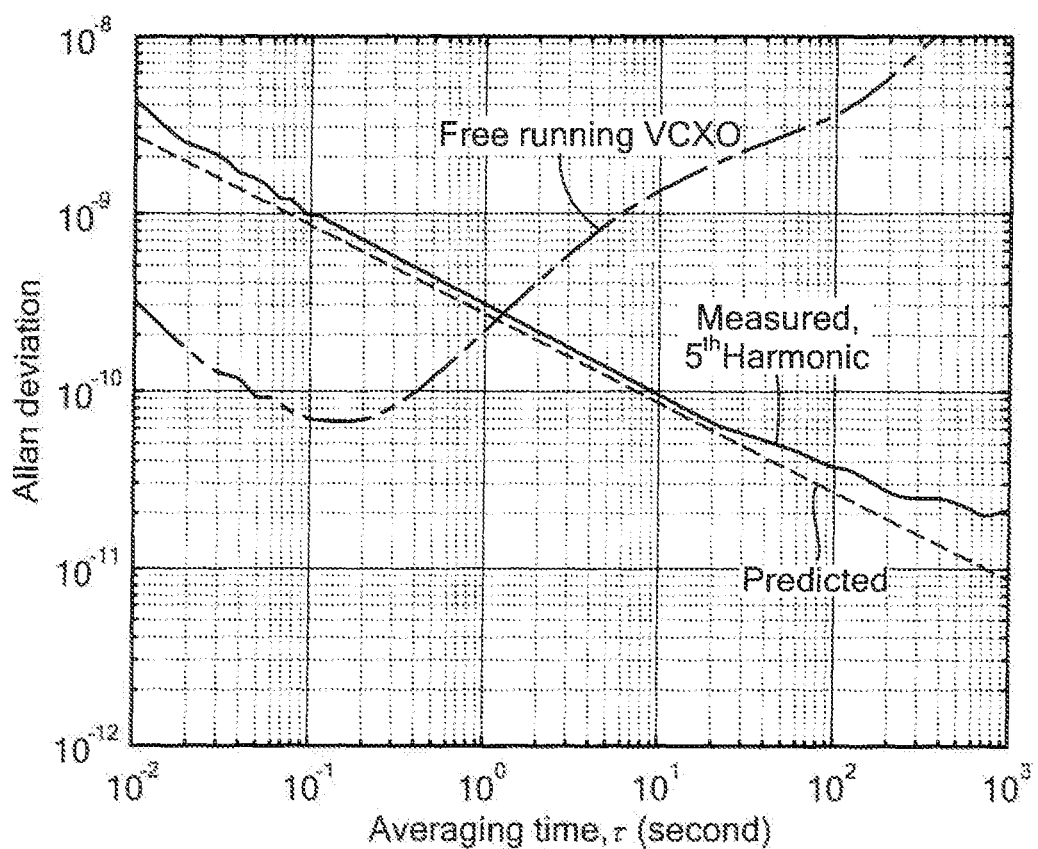

Referring now to FIGS. 20-20E, by locking the molecular clock to the three dispersion curves, the measured instantaneous frequency and Allan deviation are shown. The measurement time for each curve is 4000 s. The predicted Allan deviation based on the measured transceiver noise $V_{r,n}$ may be determined using known techniques and the slope of zero-crossing point $K_r$ is also included. An excellent coincidence exists for the short-term (τ<1 s). For the fundamental, $3^{rd}$ and $5^{th}$ harmonics, the Allan deviations $\sigma_y$ with τ=1 s reach $6.9 \times 10^{-11}$, $2.0 \times 10^{-10}$, and $3.2 \times 10^{-10}$, respectively. The fundamental dispersion curve defeats the others due to higher SNR. It is also noticed that the molecular clock disturbs the VCXO for short-term in exchange of long-term stability enhancement. However, a different pattern is observed for the long-term. The measured long-term Allan deviation with τ=$10^3$ s are $1.8 \times 10^{-10}$, $5.1 \times 10^{-11}$, and $2.2 \times 10^{-11}$ for fundamental, $3^{rd}$ and $5^{th}$ harmonics, respectively. This is because of the non-flat frequency response introduced by the standing wave and gain slope of the transceiver. While performing WMS, the dispersion curve is uneven below $f_0$ and above $f_0$. The imbalance shifts the zero-crossing point. Thus, a small frequency error is generated, which is proportional to FWHM. In the current prototype, a leakage rate of 0.1 Pascal/hour is observed for our gas cell, which changes the FWHM and then results in long-term frequency drift. Dispersion curves of high order harmonics have improved symmetry, which can be used to mitigate the frequency drift due to gain flatness. Therefore, the $5^{th}$ harmonic exhibits superior long-term stability. The further analysis of long-term stability on pressure dependency, Stark effect and Zeemann effect are included in method.

The SNR for the fundamental, $3^{rd}$ and $5^{th}$ harmonic dispersion curves shown in FIG. 5 above are $2.14\times10^4$, $1.18\times10^4$ and $3.64\times10^3$, respectively.

Promising stability has been demonstrated on an instrument based molecular clock. Chip-scale integration on silicon of such a device can make a molecular clock of the type described herein competitive with CSAC with respect to cost, power consumption and size.

Described herein is a clock based upon a new physical mechanism: rotational spectral line of gas molecules in sub-THz region. Promising short-term Allan deviation has been obtained in an instrument based prototype, which is comparable with CSAC. It also benefits from the instantaneous "turn-on" feature and wide loop bandwidth. No shielding structure for electromagnetic field is applied. Owing, in part, to the rapid progress of CMOS technology, chip-scale integration of a molecular clock has also been realized. It effectively reduces the cost, power consumption and size. The performance of CMOS molecular clock still has a significant margin for improvement: (1) There are many molecules with intensive absorption in THz region. For instance, a water ($^1H_2^{16}O$) line at 556.936 GHz (J=1←0) presents 47× stronger integrated absorption intensity than OCS (J=22←21). OCS is not the only choice. (2) Currently, the SNR of CMOS molecular clock is limited by the loss of waveguide-to-chip transition, the phase noise of on-chip PLL, and the noise of homodyne detector. Improved EM and circuit design are necessary to fill the gap between the two prototypes. (3) The energy efficiency of the clock can also be enhanced by removing the VCXO, which consumes 10~20 mW of DC power. Crystal free molecular clock is achievable since the usage of VCXO is only for the "start-up" condition. A total DC power consumption of ~40 mW is highly possible. (4) The volume of molecular clock can be reduced to below 10 $cm^3$. In the CMOS molecular clock, the WR4.3 waveguide gas cell only has a volume of 5.7 $cm^3$. Most of the total 50 $cm^3$ volume is taken by the vacuum sealing and flange. Working with spectral line at higher frequency can further reduce the size of gas cell too. In total, although the molecular clock in the paper is just on its initial phase, a highly stable, portable and energy efficient time generators is highly predictable.

The 267.530 GHz signal for spectral line probing is generated by a WR3.4 multiplier chain (×18) from Virginia Diode Inc. (VDI) driven by a Keysight E8257D signal generator ($f_{out}$=14.863 GHz), A WR3.4 VDI heterodyne receiver cascaded by a LNA (Mini-circuits ZX60-6013E-S+), a bandpass filter, a square-law detector (Crystek CPDE-TLS-4000) and a Stanford Research System SR865A lock-in amplifier performs error signal detection. The intermediate signal $f_{IF}$ is 950 MHz. The modulation signal $f_m$=100 kHz, generated by SR865A, is feeding to E8257D. All of the above instruments are referenced to a 10 MHz VCXO (80 MHz Crystek CVHD-950 divided by 8). The analog output of lock-in amplifier controls the VCXO for the feedback after integration of a RC filter (C=10 μF, R=50 kΩ). The baseband amplification is also provided by SR865A. The overlapping Allan deviation is measured by Keysight 53230A frequency counter, which takes 10 MHz Stanford Research System SR625 Rubidium time base as the reference.

The rotational spectral lines of OCS in sub-THz band provide FWHM of ~1 MHz, 1000× of the electron transition of alkali atoms in CSAC (FHWH≈1 kHz). In WMS, to concentrate RF energy nearby the spectral line, the modulation frequency $f_m$ needs to be roughly 10× lower than FWHM. A loop filter with 3 dB bandwidth at least 10× lower than $f_m$ is necessary for further integration. By adopting an one-stage RC filter, the 0 dB open loop bandwidth is defined as $f_{BW}$=$K_vK_rG/(2\pi RC)$. $f_{BW}$<$f_m$ is in demand for loop stability, since a pole nearby $f_m$ exists for lock-in detection. Therefore, the maximum loop bandwidth is $f_{Bw,max}$≈0.1× FWHM. Molecular clock then has 1000× wider loop bandwidth than CSAC. Broader loop bandwidth leads to faster frequency settling. If a disturbance voltage δV with step function appears, the time response is expressed as:

$$\frac{V_{xo}(t)}{\delta V} = \frac{1}{K_VK_rG} + e^{-\frac{K_VK_RG}{RC}t} \quad (3)$$

The settling time $T_s$ that Equation (3) reduces to twice of its first term is:

$$T_s=RC\cdot \ln(K_vK_rG)/(K_vK_rG).$$

The instrument based prototype utilizes 267.530239 GHz (J=22←21) spectral line of OCS with $f_m$ of 100 kHz, Δf of 1 MHz, and open loop gain $G_{DC}$ of $9.3\times10^3$. ARC filter with 3 dB cut off frequency of 0.32 Hz is adopted. Thus, the 0 dB open loop bandwidth is $f_{BW}$=3.0 kHz, and the settling time is $T_s$=0:49 ms. Although the current prototype hasn't been optimized for the maximum bandwidth, it still can easily deal with the disturbances below 1 kHz, which is hard for CSAC.

The long-term stability of clock is determined by the systematic frequency drift rather than noise. It includes: (1) The drift of free running VCXO, which is ~$10^{-8}$ for τ=$10^3$ s. The molecular clock presents a finite open loop gain of $G_{DC}$=$9.3\times10^3$, the drift of VCXO is then reduced to $1\times10^{-12}$. Sufficient high DC gain is in demand to reduce the frequency drift of VCXO. (2) The temperature dependency. The temperature change causes pressure variation due to the ideal gas law, which doesn't only broaden the spectral line but also shift the center frequency because of weak collision of molecules. The chosen spectral lines (J=22←21 and J=19←18) of OCS have a reported pressure dependency of $3\times10^{-10}$/Pascal, which is also verified by our measurement. It corresponds to a temperature dependency of $1\times10^{-11}$/K. In addition, even under a constant pressure, the line width and peak absorption intensity will also change under temperature variation due to velocity dependency of collision cross section. However, it is less significant than pressure. (3) The Stark effect that the electrical field twists the dipole of molecules brings with frequency shift and hyperfine structure of energy level. The chosen spectral line of OCS has a power dependency of 3 kHz/W.

Since the RF power is below −10 dBm, 10% variation of RF power corresponds to a stability of $1\times10^{-13}$. Thus, no special power stabilization is needed.

The Zeeman effect of the magnetic field is less prominent compared with Stark effect in most molecules. It has frequency shift of $10^{-10}$/Gauss in our case. Thus, a common magnetic field shielding of 100× can reduce the magnetic field dependency to $10^{-12}$/Gauss.

All publications and references cited herein are expressly incorporated herein by reference in their entirety.

What is claimed is:
1. A molecular clock comprising:
  a waveguide gas cell having a radio frequency (RF) input port, an RF output port and a gas inlet/outlet, the waveguide gas cell being sealed so as to be capable of holding gaseous molecules having a linear structure, the waveguide gas cell configured to receive the gaseous molecules having a linear structure via the gas inlet/outlet; and the waveguide gas cell having a rectangular cross-section and a meander profile along a central longitudinal axis thereof.

2. The molecular clock of claim 1 wherein the gaseous molecules having a linear structure are provided as a carbonyl sulfide compound (OCS).

3. The molecular clock of claim 2 wherein the gaseous molecules having a linear structure are provided as the carbonyl sulfide compound (OCS) having a rotational spectrum in the frequency range of about 12 GHz to about 1 THz.

4. The molecular clock of claim 2 wherein the gaseous molecules having a linear structure are provided as the carbonyl sulfide compound (OCS) having a rotational spectrum in the range of about 200 GHz to about 300 GHz.

5. The molecular clock of claim 2 wherein gaseous molecules having a linear structure are provided as $^{16}O^{12}C^{32}S$.

6. The molecular clock of claim 1 further comprising:
a transmitter having an RF output port coupled to the RF input port of the waveguide gas cell;
a receiver having an RF input port and an RF output port with the RF input port coupled to the RF output port of the waveguide gas cell; and
a feedback circuit having an input coupled to the output port of the receiver and having an output coupled to an input port of the transmitter, the feedback circuit configured to generate a feedback signal in response to a frequency of a signal output by the transmitter and a frequency of rotational-state transitions of the gaseous molecules.

7. The molecular clock of claim 6 wherein the transmitter further comprises:
a voltage-controlled oscillator (VCO) having an input coupled to the output of said feedback circuit and having an output coupled to an input of said transmitter circuit.

8. The molecular clock of claim 7 wherein:
the VCO is provided as a voltage-controlled crystal oscillator (VCXO); and
the feedback circuit provides a feedback signal to the VCXO.

9. The molecular clock of claim 6 wherein the receiver further comprises:
a detector capable of detecting an RF signal provided from the output of the waveguide gas cell and providing a differential output;
a low noise amplifier (LNA) having a differential RF input coupled to the differential output of the detector and having a differential RF output; and
a lock in detector having an input configured to receive a differential RF output from the LNA and having an output coupled to the receiver RF output port and at which an error signal is provided.

10. A molecular clock comprising:
a waveguide gas cell having a radio frequency (RF) input port, an RF output port and a gas inlet/outlet, the waveguide gas cell capable of holding gaseous molecules having a linear structure, the waveguide gas cell having a rectangular cross-section and a meander profile along a central longitudinal axis, the waveguide gas cell configured to be sealed to hold the gaseous molecules;

an integrated circuit comprising:
a substrate;
an RF transmitter circuit disposed on said substrate, the RF transmitter circuit having an input and having an RF output port;
a first chip-to-waveguide transition coupled between the RF output port of the transmitter and the RF input port of the waveguide gas cell;
an RF receiver circuit disposed on the substrate, the RF receiver circuit having an RF input port and an RF output port, the RF output port coupled to the input of a feedback circuit, the RF receiver circuit configured to receive a signal corresponding to rotational-state transitions of the gaseous molecules; and
a second chip-to-waveguide transition coupled between the RF output port of the waveguide gas cell and the RF input port of the receiver, the first and second transitions comprising a quartz probe; and
the feedback circuit having an input coupled to the RF output port of the receiver and having an output coupled to the output of the RF transmitter, the feedback circuit configured to generate a feedback signal in response to a frequency of a signal output by the transmitter and the signal corresponding to rotational-state transitions of the gaseous molecules.

11. The integrated circuit of claim 10 wherein the waveguide gas cell is capable of holding a carbonyl sulfide compound (OCS) having a rotational spectrum of linear polar molecules in one of:
a millimeter frequency range; and
a sub-terahertz (THz) frequency range.

12. The molecular clock of claim 11 wherein the waveguide gas cell is capable of holding $^{16}O^{12}C^{32}S$ having a rotational spectrum in the range of about 12 GHz to about 1 THz.

13. The molecular clock of claim 10 wherein the integrated circuit is provided as a CMOS integrated circuit.

14. The integrated circuit of claim 10 wherein the RF transmitter comprises a voltage-controlled oscillator (VCO) having an input coupled to the output of said feedback circuit and having an output coupled to the input of the waveguide gas cell via the first chip-to-waveguide transition.

15. The integrated circuit of claim 14 wherein:
the VCO is provided as a differential voltage-controlled crystal oscillator (VCXO); and
the feedback circuit provides a differential feedback signal to the differential VCXO.

16. A molecular clock comprising:
a waveguide gas cell having a radio frequency (RF) input port, an RF output port and a gas inlet/outlet, the waveguide gas cell configured to receive gaseous molecules having a linear structure via the gas inlet/outlet;
the waveguide gas cell having a rectangular cross-section and a meander profile along a central longitudinal axis, the waveguide gas cell configured to be sealed to hold the gaseous molecules;
a transmitter coupled to the RF input port of the waveguide gas cell via a probe; and
a receiver coupled to RF output port of the waveguide gas cell via a probe, the receiver configured to receive a signal corresponding to rotational-state transitions of the gaseous molecules.

17. The molecular clock of claim 16 further comprising:
a feedback circuit having an input coupled to the output port of the receiver and having an output coupled to an input port of the transmitter, the feedback circuit configured to generate a feedback signal in response to a frequency of a signal output by the transmitter and the signal corresponding to rotational-state transitions of the gaseous molecules.

18. The molecular clock of claim 17 wherein the waveguide gas cell is capable of holding a carbonyl sulfide compound (OCS) having a rotational spectrum of linear polar molecules in one of:

a millimeter frequency range; and a sub-terahertz (THz) frequency range.

19. The molecular clock of claim 16 further comprising a vacuum pump coupled to the gas inlet/outlet configured to draw the gaseous molecules into and out of the waveguide gas cell.

* * * * *